United States Patent
Wakimoto et al.

(10) Patent No.: US 9,269,921 B2
(45) Date of Patent: Feb. 23, 2016

(54) LIGHTING DEVICE

(75) Inventors: Kenichi Wakimoto, Hakodate (JP); Akihiro Chida, Kanagawa (JP); Kohei Yokoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 173 days.

(21) Appl. No.: 13/275,522

(22) Filed: Oct. 18, 2011

(65) Prior Publication Data

US 2012/0097982 A1    Apr. 26, 2012

(30) Foreign Application Priority Data

Oct. 20, 2010    (JP) .................................. 2010-235089

(51) Int. Cl.
*H01L 33/58* (2010.01)
*H01L 33/62* (2010.01)
*H01L 51/52* (2006.01)

(52) U.S. Cl.
CPC ........ *H01L 51/5237* (2013.01); *H01L 51/5203* (2013.01); *H01L 51/524* (2013.01);
(Continued)

(58) Field of Classification Search
CPC .............. H01L 2251/5361; H01L 2251/5315; H01L 2251/558; H01L 51/5025; H01L 51/524; H01L 2933/0083; H01L 2933/0091; H01L 51/5268; H01L 51/5275; H01L 51/5237; H01L 51/52; H01L 27/3288; H01L 27/3276; H01L 51/5203; H01L 51/56; G02F 1/13452; H05B 33/04; H05B 33/06; H05B 33/08; H05B 33/26; G02B 6/0078; G02B 6/00958; G02B 6/0095; F21K 9/13; F21Y 2105/00; F21V 23/06; F21V 23/005; F21V 15/01; H04M 1/0262; G09G 2300/0426; H01S 5/0425

USPC ................. 257/79, 81, 98, 99, 100, E33.058, 257/E33.067, E33.077; 362/362, 365, 367, 362/368, 375
See application file for complete search history.

(56) References Cited

U.S. PATENT DOCUMENTS 6,084,299 A * 7/2000 Questad et al. ............... 257/707
7,009,156 B2  3/2006 Maeuser
(Continued)

FOREIGN PATENT DOCUMENTS

JP    06-223972 A    8/1994
JP    07-263142 A    10/1995
(Continued)

OTHER PUBLICATIONS ("Coupling Efficiency Enhancement in Organic Light-Emitting Devices Using Microlens Array—Theory and Experiment," Huajun Peng, Yeuk Lung Ho, Xing-Jie Yu, Man Wong, Hoi-Sing Kwok. Journal of Display Technology, vol. 1, No. 2, Dec. 2005, pp. 278-283, 281.*

(Continued)

*Primary Examiner* — Tom Thomas
*Assistant Examiner* — John Bodnar
(74) *Attorney, Agent, or Firm* — Husch Blackwell LLP

(57) ABSTRACT

A lighting device including an electroluminescent (EL) material is connected to an external power supply easily and the convenience is improved. In a lighting device having a light-emitting element including an electroluminescence (EL) layer, a housing including a light-emitting element has a terminal electrode electrically connected to the light-emitting element on a peripheral end portion. The terminal electrode provided on the housing so as to be exposed to the outside is in contact with a terminal electrode for the external power supply, so that the external power supply and the light-emitting element are electrically connected to each other and power can be supplied to the lighting device.

18 Claims, 13 Drawing Sheets

(52) U.S. Cl.
CPC ......... *H01L51/5212* (2013.01); *H01L 51/5243* (2013.01); *H01L 51/5275* (2013.01); *H01L 2251/5361* (2013.01)

(56) References Cited

U.S. PATENT DOCUMENTS

| | | | |
|---|---|---|---|
| 7,205,717 B2 * | 4/2007 | Cok | 313/512 |
| 7,354,327 B2 | 4/2008 | Maeuser | |
| 7,859,627 B2 | 12/2010 | Nishida et al. | |
| 8,328,582 B1 * | 12/2012 | Carley et al. | 439/642 |
| 8,809,878 B2 | 8/2014 | Ota | |
| 2002/0068191 A1 * | 6/2002 | Kobayashi | 428/690 |
| 2003/0143423 A1 * | 7/2003 | McCormick et al. | 428/690 |
| 2003/0203700 A1 * | 10/2003 | Clark | 445/25 |
| 2003/0213967 A1 * | 11/2003 | Forrest et al. | 257/96 |
| 2004/0012747 A1 * | 1/2004 | Yamazaki et al. | 349/153 |
| 2004/0217928 A1 * | 11/2004 | Yamazaki et al. | 345/81 |
| 2005/0056638 A1 | 3/2005 | Maeuser | |
| 2005/0258436 A1 | 11/2005 | Arai | |
| 2005/0285520 A1 * | 12/2005 | Cok | 313/512 |
| 2006/0087224 A1 * | 4/2006 | Oki et al. | 313/504 |
| 2007/0029928 A1 * | 2/2007 | Choi et al. | 313/504 |
| 2008/0117519 A1 * | 5/2008 | Chari et al. | 359/619 |
| 2008/0129184 A1 | 6/2008 | Nishida et al. | |
| 2008/0129933 A1 | 6/2008 | Nishida et al. | |
| 2008/0130122 A1 | 6/2008 | Egi et al. | |
| 2010/0073905 A1 * | 3/2010 | Hsin-Nung | 362/97.1 |
| 2011/0134647 A1 | 6/2011 | Nishida et al. | |
| 2012/0086362 A1 | 4/2012 | Ota | |
| 2012/0228667 A1 * | 9/2012 | Boerner | 257/99 |
| 2012/0292652 A1 * | 11/2012 | Yamae et al. | 257/98 |

FOREIGN PATENT DOCUMENTS

| | | | |
|---|---|---|---|
| JP | 10-172757 | | 6/1998 |
| JP | 2010-19881 | * | 2/2000 |
| JP | 2000058255 | * | 2/2000 |
| JP | 2002-343559 | * | 1/2002 |
| JP | 2002-343559 | * | 11/2002 |
| JP | 2005-513753 | | 5/2005 |
| JP | 2005-332773 | | 12/2005 |
| JP | 2007-254743 | * | 4/2007 |
| JP | 2007-173088 A | | 7/2007 |
| JP | 2007-173424 | | 7/2007 |
| JP | 2010-19881 | * | 9/2010 |
| JP | 2010-198881 | * | 9/2010 |
| JP | 2010-218897 | | 9/2010 |
| JP | 2010198881 | * | 9/2010 |
| JP | 2012-084370 A | | 4/2012 |

OTHER PUBLICATIONS

Peng et al. (Journal of Display Technology, vol. 1, p. 278, Dec. 2005).*
Calculations by Peng et al. (Journal of Display Technology, vol. 1, p. 278, Dec. 2005 incorporated here as reference.*

* cited by examiner

FIG. 13A1
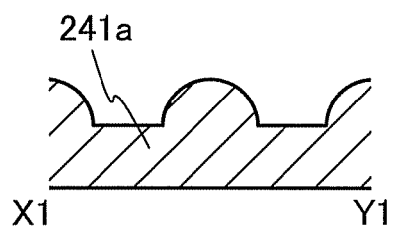
FIG. 13A2
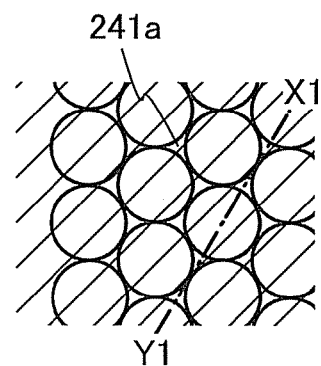
FIG. 13B1
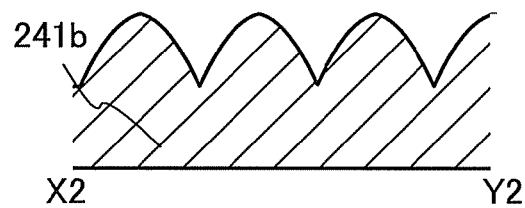
FIG. 13B2
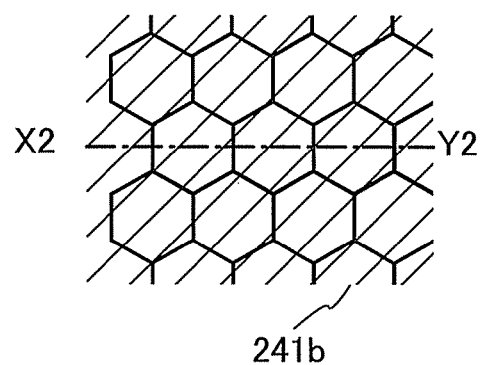

LIGHTING DEVICE

BACKGROUND OF THE INVENTION

1. Field of the Invention

One embodiment of the present invention relates to a lighting device including a light-emitting member exhibiting electroluminescence.

2. Description of the Related Art

As a next-generation lighting device, a lighting device using an electroluminescent material has attracted attention because it is estimated to have higher emission efficiency than filament bulbs or fluorescent bulbs. A thin film of an electroluminescent material can be formed to a thickness of 1 μm or less by evaporation or coating. Further, the form of such a lighting device has been devised; for example, a lighting device using an electroluminescent material in which the luminance is kept constant even when the area of the lighting device is increased is disclosed (for example, see Patent Document 1).

REFERENCE

[Patent Document 1] Japanese Published Patent Application No. 2005-332773

SUMMARY OF THE INVENTION

A lighting device such as that described above is turned on when power is supplied from an external power supply.

An object of one embodiment of the present invention is to connect a lighting device using an electroluminescent material to an external power supply more easily and to improve the convenience.

In a lighting device having a light-emitting element including an electroluminescence (EL) layer, a housing including the light-emitting element has a terminal electrode electrically connected to the light-emitting element, on a peripheral end portion. The terminal electrode provided on the housing so as to be exposed to the outside is in contact with a terminal electrode for the external power supply, so that the external power supply and the light-emitting element are electrically connected to each other and power can be supplied to the lighting device.

One embodiment of the present invention is a lighting device including a light-emitting element including an EL layer interposed between a first electrode and a second electrode and a housing including the light-emitting element and being provided with a first terminal electrode and a second terminal electrode on a peripheral end portion. In the housing, the first electrode is electrically connected to the first terminal electrode and the second electrode is electrically connected to the second terminal electrode. A region of the housing, which covers a light emitting surface of the light-emitting element, and at least one of the first electrode and the second electrode have a light-transmitting property. One of the first electrode and the second electrode is provided in the light emitting surface of the light-emitting element. The first terminal electrode and the second terminal electrode are in contact with respective terminal electrodes for an external power supply, so that the external power supply and the light-emitting element are electrically connected to each other. Note that in this specification, a light-transmitting property means a property to transmit light at least of a wavelength region of visible light.

Another embodiment of the present invention is a lighting device including a light-emitting element including an EL layer interposed between a first electrode and a second electrode and a housing including the light-emitting element and being provided with a first terminal electrode, a second terminal electrode, a third terminal electrode, and a fourth terminal electrode provided on a peripheral end portion. In the housing, the first electrode is electrically connected to the first terminal electrode, the second electrode is electrically connected to the second terminal electrode, and the third terminal electrode and the fourth terminal electrode are electrically connected to a sensor element. A region of the housing, which covers a light emitting surface of the light-emitting element, and at least one of the first electrode and the second electrode have a light-transmitting property. One of the first electrode and the second electrode is provided in the light emitting surface of the light-emitting element. The first terminal electrode, the second terminal electrode, the third terminal electrode, and the fourth terminal electrode are in contact with respective terminal electrodes for an external power supply, so that the external power supply, the light-emitting element, and the sensor element are electrically connected to each other.

As the sensor element, a thermistor detecting temperature can be used, for example. On the basis of temperature detected by the sensor element, a value of a current, a voltage, or the like supplied to the lighting device can be controlled.

The first electrode and the second electrode of the light-emitting element may be electrically connected to the first terminal electrode and the second terminal electrode through an extraction terminal provided in the housing. The extraction terminal can be formed in the same step as the light-emitting element.

Further, the number of the first terminal electrodes and the number of the second terminal electrodes may each be two or more. When the plurality of first terminal electrodes and the plurality of second terminal electrodes are provided, a larger amount of power can be supplied. The number of the light-emitting elements provided in the housing may be two or more and each of the light-emitting elements may be independently connected to a terminal electrode provided on the peripheral end portion of the housing or the plurality of light-emitting elements may be electrically connected in series or in parallel to each other may be connected to one terminal electrode.

An inorganic insulating film covering a top surface of the light-emitting element is preferably provided. Further, an inorganic insulating film may be provided between a light emitting surface of the light-emitting element and the housing. The inorganic insulating film functions as a sealing film or a protective layer which protects the light-emitting element from an external contaminant such as water. The inorganic insulating film can be formed to have either a single layer or a stacked layer using a nitride film and a nitride oxide film. Deterioration of the light-emitting element can be reduced and the durability and the lifetime of the lighting device can be improved by providing the inorganic insulating film.

The shape of the light emitting surface of the light-emitting element may be a circular shape or a polygonal shape such as a tetragon. The shape of the housing covering the light-emitting element may correspond to the shape of the light emitting surface and can be a rectangular solid, a polygonal cylinder, a cylinder, or the like.

Further, two or more EL layers may be provided with an intermediate layer interposed therebetween. A color of emitted light can be adjusted by stacking a plurality of EL layers with different emission colors. Even when a stack of a plurality of EL layers having the same emission color is provided, there is an effect of improving the power efficiency.

In a lighting device which is one embodiment of the present invention, a terminal electrode provided on a housing so as to be exposed to the outside is in contact with a terminal electrode for an external power supply, so that the external power supply and a light-emitting element are electrically connected to each other and thus, the lighting device can be supplied with power. Therefore, the lighting device and the external power supply can be more easily connected to each other and the convenience of the lighting device can be improved.

BRIEF DESCRIPTION OF THE DRAWINGS

FIGS. 13A1, 13A2, 13B1, and 13B2 are cross-sectional views and plan views illustrating a lighting device.

DETAILED DESCRIPTION OF THE INVENTION

Figure 1:
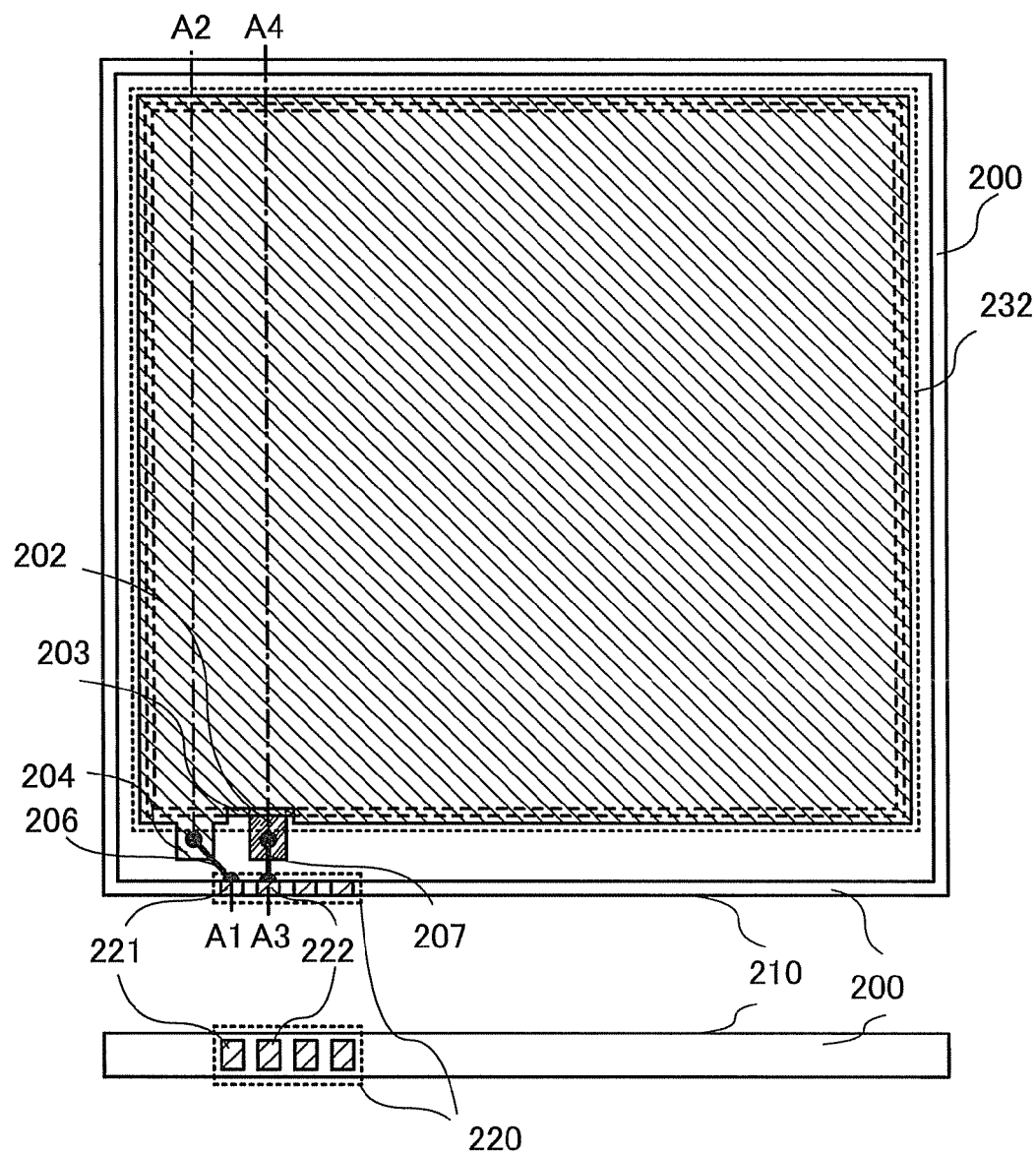
FIG. 1 illustrates a lighting device.

Embodiments will be described in detail with reference to the drawings. Note that the invention disclosed in this specification is not limited to the following description, and it is easily understood by those skilled in the art that modes and details can be modified in a variety of ways without departing from the spirit and scope of the present invention. Therefore, the present invention should not be construed as being limited to the following description. In the structures to be given below, the same portions or portions having similar functions are denoted by the same reference numerals in different drawings, and explanation thereof will not be repeated.
(Embodiment 1)
In this embodiment, one embodiment of a lighting device of the present invention will be described with reference to FIG. 1, FIG. 2, FIG. 3, FIGS. 4A and 4B, FIG. 5, FIGS. 6A and 6B, and FIGS. 10A and 10B.

Figure 2:
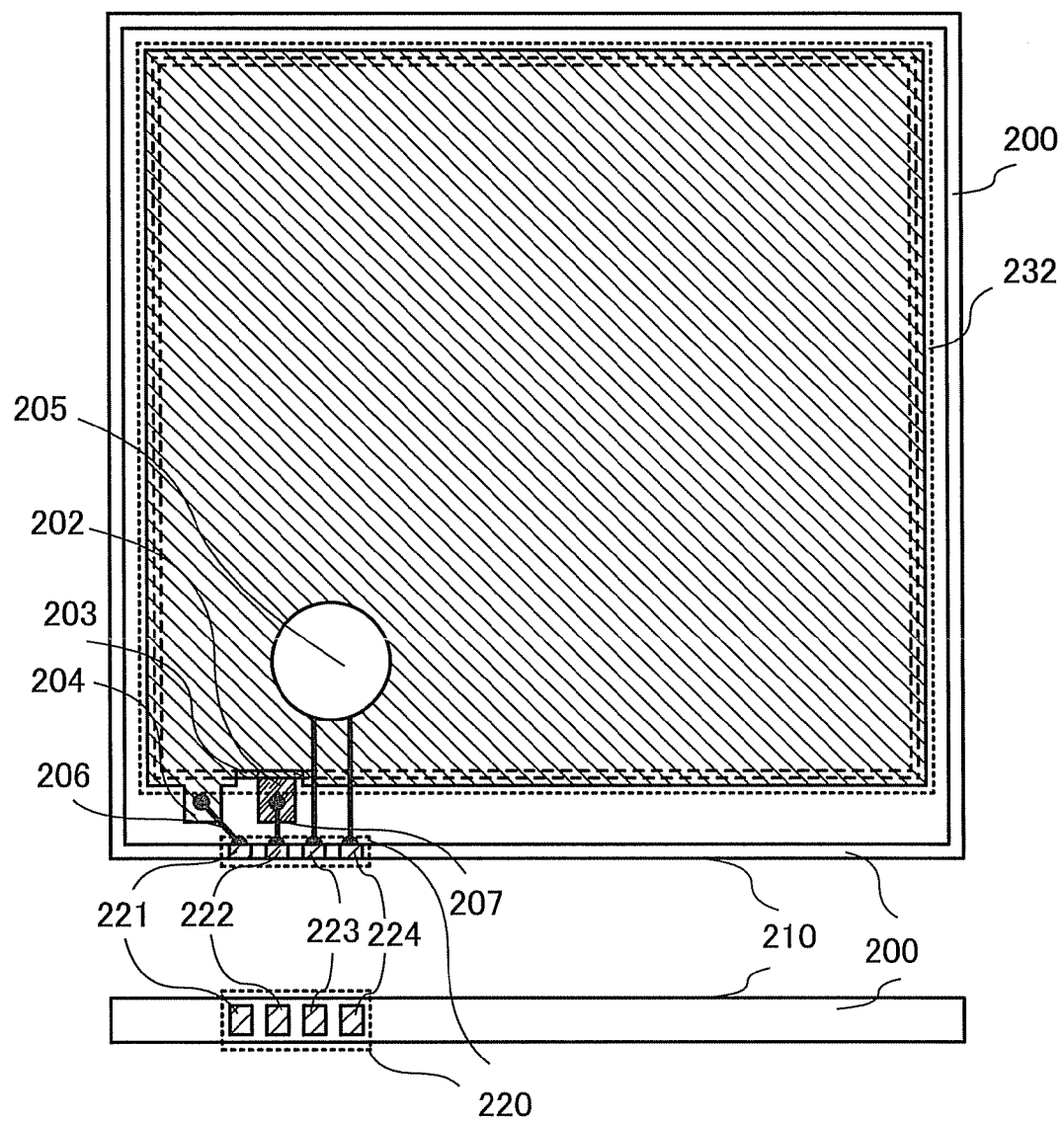
FIG. 2 illustrates a lighting device.
Figure 3:
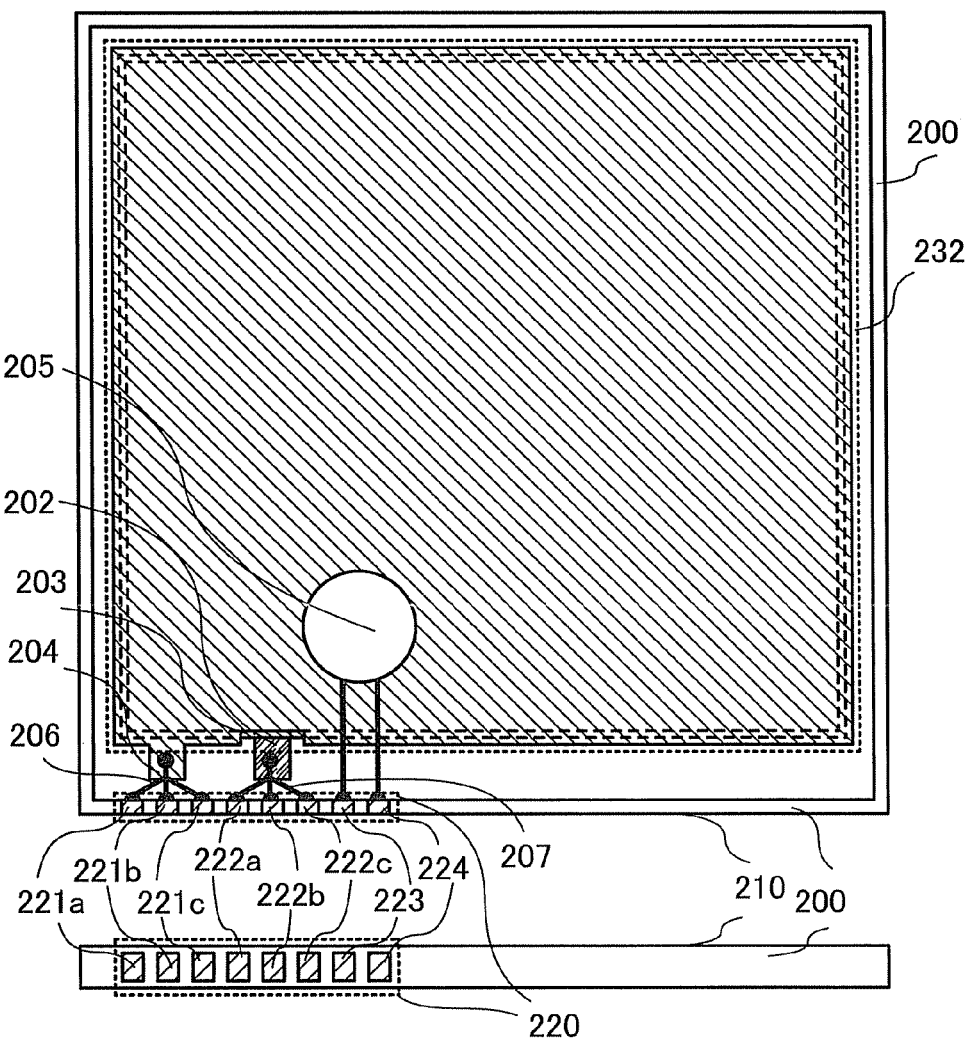
FIG. 3 illustrates a lighting device.
Figure 6A:
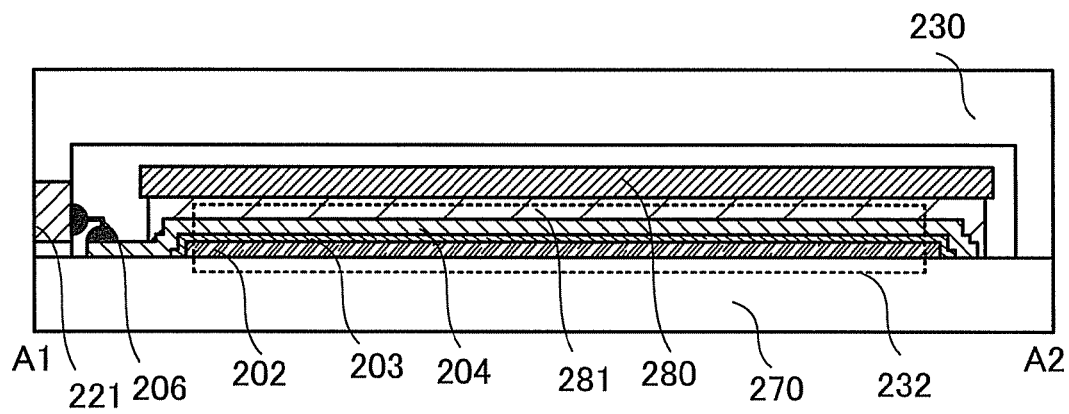
FIGS. 6A and 6B are cross-sectional views illustrating a lighting device.
Figure 6B:
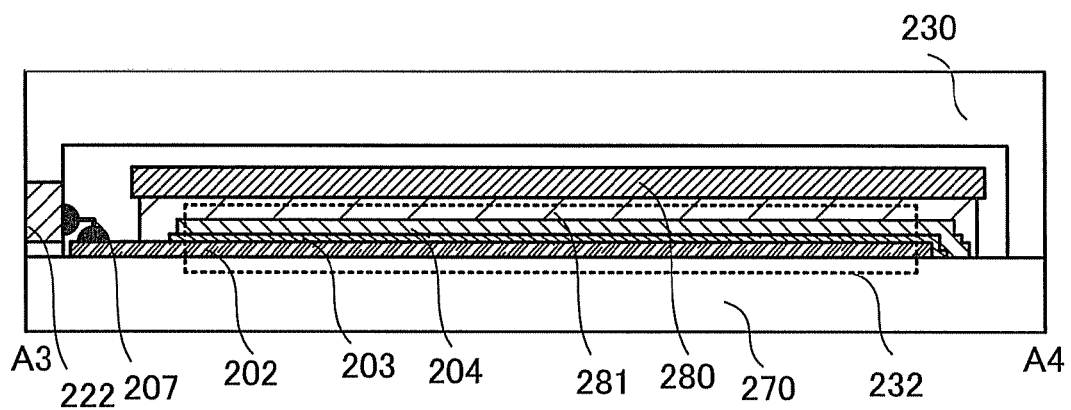

FIG. 1, FIG. 2, and FIG. 3 are diagrams each illustrating a lighting device, and upper diagrams are plan views and lower diagrams are side views. FIG. 6A is a cross-sectional view along line A1-A2 in the plan view of FIG. 1 and FIG. 6B is a cross-sectional view along line A3-A4 in the plan view of FIG. 1.

In a lighting device 210 illustrated in FIG. 1, a housing 200 including a light-emitting element 232 including an EL layer 203 has a terminal electrode 220 (a first terminal electrode 222 and a second terminal electrode 221), which is electrically connected to the light-emitting element 232, on a peripheral end portion.

The shape of a light emitting surface of the light-emitting element 232 may be a circular shape or a polygonal shape such as a tetragon. The shape of the housing 200 covering the light-emitting element 232 may correspond to the shape of the light emitting surface and can be a rectangular solid, a polygonal cylinder, a cylinder, or the like. The light-emitting element 232 used in this specification has a stacked structure of thin films, so that the housing 200 can be thin.

The housing 200 covering the light-emitting element 232 can be formed by bonding and combining a plurality of housings. An example of the housing 200 including a first housing 270 covering the light emitting surface Of the light-emitting element 232 and a second housing 230 covering a top surface of the light-emitting element 232 is illustrated in FIGS. 6A and 6B.

Figure 10A:
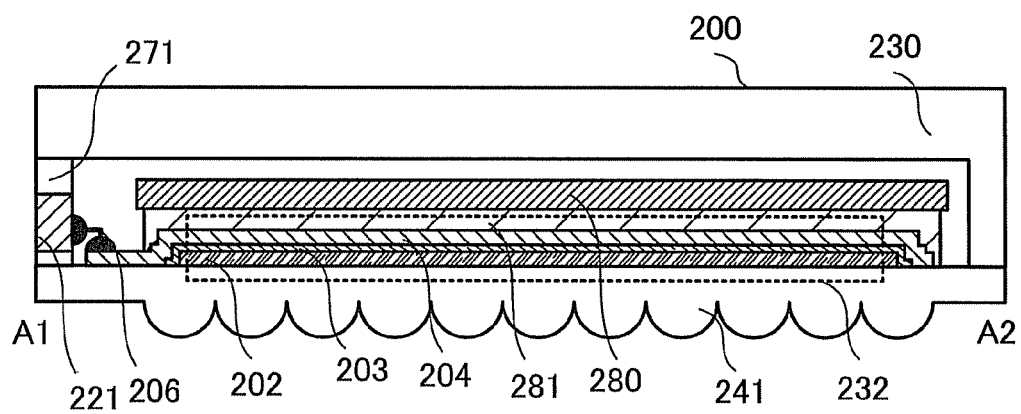
FIGS. 10A and 10B are cross-sectional views each illustrating a lighting device.
Figure 10B:
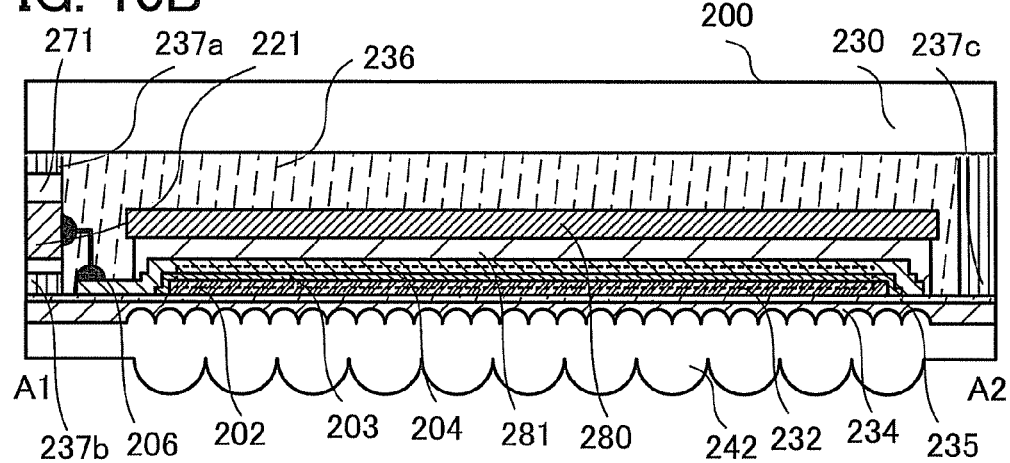

Further, FIG. 10A illustrates an example of the housing 200 including a first housing 241, a second housing 230, and a third housing 271, which are bonded. The terminal electrode 220 (the second terminal electrode 221 in FIG. 10A) is provided in the third housing 271. FIG. 10B is an example of bonding the first housing 242, the second housing 230, and the third housing 271 with bonding layers 237a, 237b, and 237c. FIG. 10B is an example of filling a space inside the housing 200 with a resin 236. The strength of the lighting device can be increased by filling the space with the resin 236.

The size of the first housings 270, 241, and 242 can be set appropriately depending on the uses of the light-emitting device. For example, a circular plate shape having a diameter of 10 cm to 14 cm, preferably a diameter of 12 cm, a square having 5 inches on each side, or the like may be used.

A bonding layer may be used for bonding and in the case where a thermoplastic organic resin is used for the housing, bonding can be performed by thermocompression treatment. As the bonding layer, a visible light curable resin, a UV curable resin, or a thermosetting resin can be used. As examples of materials of such adhesives, an epoxy resin, an acrylic resin, a silicone resin, a phenol resin, and the like are given.

As a specific example of a member used for the housing 200, plastic (an organic resin), glass, quartz, or the like can be given. As an example of plastic, a member made from polycarbonate, polyarylate, polyethersulfone, or the like is given. Note that an organic resin is preferably used for the second housing 230 covering the top surface of the light-emitting element 232. When plastic is used, the lighting device can be reduced in weight.

The light-emitting element 232 includes a first electrode 202, an EL layer 203, and a second electrode 204. Light from the EL layer 203 is emitted to the outside through the first electrode 202 and the first housing 270; therefore, the first electrode 202 side is the light emitting surface. Thus, the first electrode 202 and the first housing 270 have a light-transmitting property which transmits light at least from the EL layer 203.

Note that in this specification, an element utilizing an effect of electroluminescence (EL) for a principle of light emission is referred to as the light-emitting element. Specifically, for the light-emitting element 232 of this embodiment, a light emitting diode (LED), an organic EL element, an inorganic EL element, or the like can be used. For example, when an LED is used for the light-emitting element 232, one or more of aluminum gallium arsenide (AlGaAs), gallium arsenide phosphide (GaAsP), indium gallium nitride (InGaN), gallium nitride (GaN), aluminum gallium nitride (AlGaN), gallium phosphide (GaP), zinc selenide (ZnSe), aluminum gallium indium phosphide (AlGaInP), can be used for a material of the EL layer 203.

In the housing 200, the first electrode 202 of the light-emitting element 232 and the first terminal electrode 222 are electrically connected to each other through a wiring 207 and the second electrode 204 of the light-emitting element 232 and the second terminal electrode 221 are electrically connected to each other through a wiring 206.

As long as the first electrode 202 of the light-emitting element 232 and the first terminal electrode 222 are electrically connected to each other and the second electrode 204 of the light-emitting element 232 and the second terminal electrode 221 are electrically connected to each other, the method and the structure of electrical connection are not particularly limited. For example, a bump may be formed in the connection portion to obtain the connection, an anisotropic conductive film may be used, or a conductive film may be formed using a material which can be connected by a solder so that the connection is obtained with the use of a solder. A resin for fixing the connection portion may be provided around the connection portion.

FIG. 2 illustrates an example of the lighting device 210 provided with a sensor element 205 and the sensor element 205 is connected to a third terminal electrode 223 and a fourth terminal electrode 224 which are provided on the peripheral end portion of the housing 200 and adjacent to the first terminal electrode 222 and the second terminal electrode 221. For the sensor element 205, a thermistor detecting temperature can be used, for example. As the thermistor, a negative temperature coeffcient (NTC) thermistor whose resistance value decreases by increase of temperature, a positive temperature coefficient (PTC) thermistor whose resistance value increases by increase of temperature, or the like can be used. On the basis of temperature detected by the sensor element 205, a current, a voltage value, or the like supplied to the lighting device 210 can be controlled.

Further, a plurality of first terminal electrodes 222 and a plurality of second terminal electrodes 221 may be provided. FIG. 3 illustrates an example of the lighting device 210 provided with first terminal electrodes 222a, 222b, and 222c and second terminal electrodes 221a, 221b, and 221c. The first terminal electrodes 222a, 222b, and 222c are electrically connected to the first electrode 202 through the wirings 207 and the second terminal electrodes 221a, 221b, and 221c are electrically connected to the second electrode 204 through the wirings 206. A larger amount of power can be supplied by providing the plurality of first terminal electrodes and the plurality of second terminal electrodes. The number of terminal electrodes may be adjusted as appropriate depending on a current and a voltage supplied to the lighting device 210.

In FIG. 3, connection between the first electrode 202 and the wiring 207 and connection between the second electrode 204 and the wiring 206 are each made at one portion; however, the electrode and the wirings may be connected at two or more portions. Further, the first electrode 202 and the second electrode 204 of the light-emitting element 232 may be electrically connected to the first terminal electrode 222 and the second terminal electrode 221, respectively, through extraction terminals provided in the housing 200. The extraction terminal can be formed in the same step as the light-emitting element.

Further, the number of the light-emitting elements 232 provided in the housing 200 may be two or more. Each of the light-emitting elements 232 may be independently connected to the terminal electrode 220 provided on the peripheral end portion of the housing 200 or the plurality of light-emitting elements 232 connected in series or in parallel to each other may be connected to one terminal electrode 220. For example, a plurality of light-emitting elements with different emission colors are provided and connected to respective external power supplies to control a value of a current and a voltage, whereby an emission color from the lighting device can be adjusted and the color rending property can be improved.

An example of the lighting device 210 held in a holding member (a holder) 250 provided with a terminal electrode 251 for an external power supply is described with reference to FIGS. 4A and 4B.

Figure 4A:
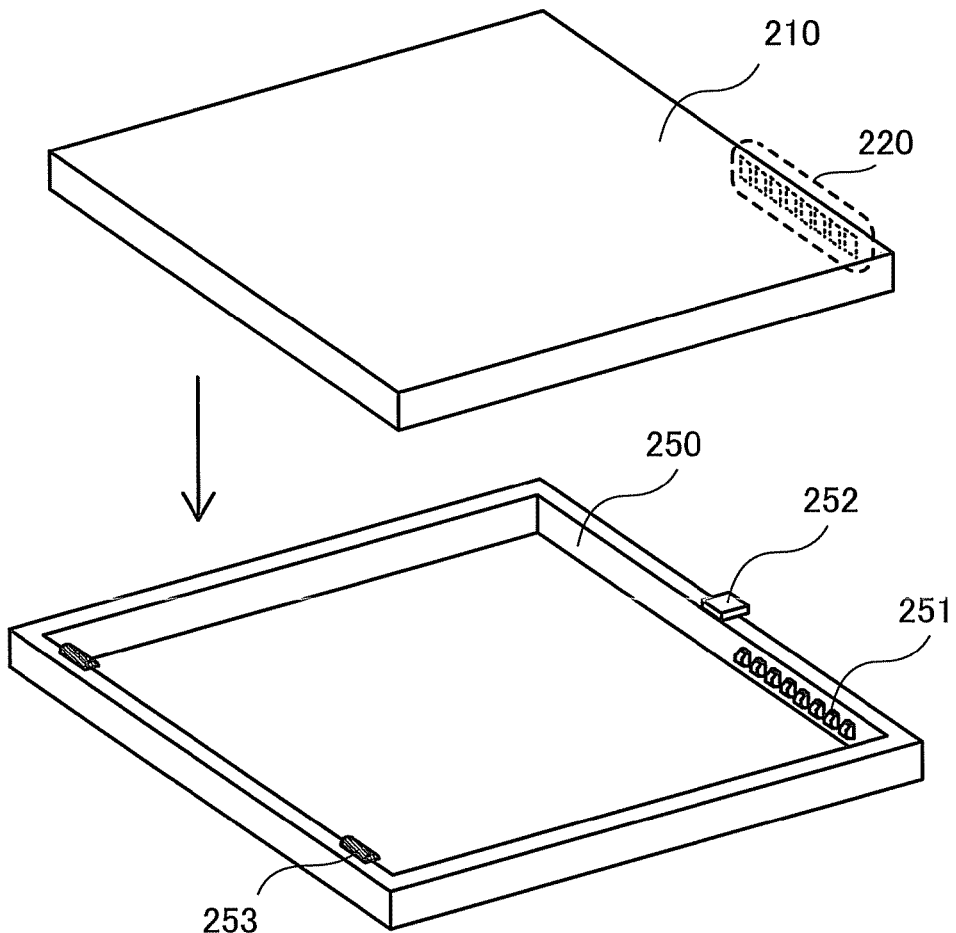
FIGS. 4A and 4B illustrate a lighting device.

The lighting device 210 is inserted into the holding member 250 in a direction indicated by an arrow in FIG. 4A so that the terminal electrode 220 (the first terminal electrode 222 and the second terminal electrode 221) provided on the housing 200 so as to be exposed to the outside is in contact with the terminal electrode 251 for the external power supply. In the housing 200, the terminal electrode 220 is provided on one side surface in the peripheral end portion of the housing 200. When the terminal electrode 220 is provided on one side surface in such a manner, positioning adjustment can be made easily at the time of making the terminal electrode 220 to be in contact with the terminal electrode 251 for the external power supply. The holding member 250 is provided with a fixing member 253 and a fixing member 252 and the fixing member 252 is movable. At the time of inserting the lighting device 210, the fixing member 252 is removed from a region where the lighting device 210 is inserted.

Figure 4B:
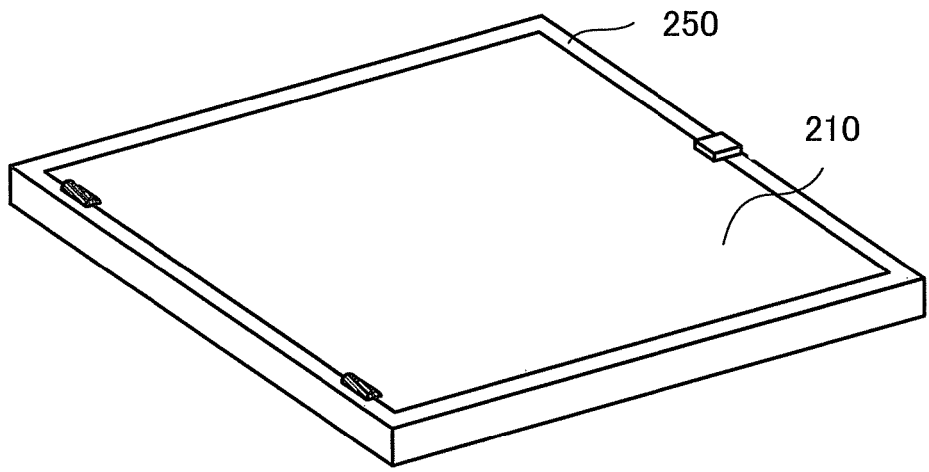

As illustrated in FIG. 4B, the lighting device 210 is inserted into the holding member 250 and the fixing member 252 is moved to the lighting device 210 side and fixed so that the lighting device 210 is not detached. The lighting device 210 is placed in the holding member 250 in a state where the terminal electrode 251 for the external power supply and the lighting device 210 is in contact with each other; thus, the external power supply and the light-emitting element 232 are electrically connected to each other and power can be supplied to the lighting device 210. When a terminal member formed of an elastic material is used for the terminal electrode 251 provided on the holding member 250, the terminal electrode 251 can be movable. Consequently, when the lighting device 210 is inserted with the terminal electrode 220 pressed against the terminal electrode 251, the electrical connection property of the lighting device 210 and the external power supply can be improved. As described the above, the lighting device and the external power supply can be easily connected to each other and the convenience of the lighting device can be improved.

Figure 5:
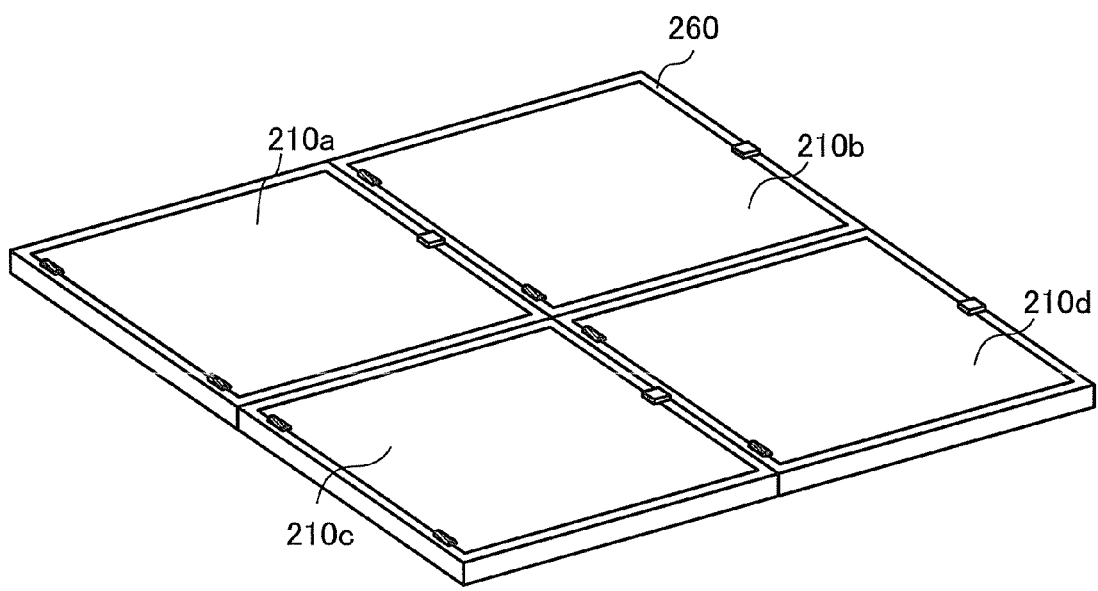
FIG. 5 illustrates a lighting device.

FIG. 5 is an example of a plurality of lighting devices 210a, 210b, 210c, and 210d arranged in a holding member 260. Thus, even when the number of lighting devices is plural, the lighting devices can be easily connected to an external power supply. Further, a light-emitting element of a highly convenient lighting device described in this embodiment is a thin film, so that the lighting device can be designed more freely. Therefore, the lighting device can be elaborately designed in various manners.

Further, an inorganic insulating film covering the top surface of the light-emitting element 232 is preferably provided. An inorganic insulating film may be provided between the light emitting surface of the light-emitting element 232 and the housing. The inorganic insulating film functions as a protective layer or a sealing film, which protects the light-emitting element 232, from an external contaminant such as water. Deterioration of the light-emitting element 232 can be reduced and the durability and the lifetime of the lighting device can be improved by providing the inorganic insulating film.

The inorganic insulating film can be formed to have either a single layer or a stacked layer using a nitride film and a nitride oxide film. Specifically, the inorganic insulating film can be formed using silicon oxide, silicon nitride, silicon oxynitride, aluminum oxide, aluminum nitride, aluminum oxynitride, or the like by CVD, sputtering, or the like depending on its material. The inorganic insulating film is preferably formed using silicon nitride by CVD. The thickness of the inorganic insulating film may be about greater than or equal to 100 nm and less than or equal to 1 μm.

Further, an aluminum oxide film, a diamond like carbon (DLC) film, a carbon film containing nitrogen, or a film containing zinc sulfide and silicon oxide may be used as the inorganic insulating film.

In addition, as illustrated in FIGS. 6A and 6B, a metal plate 280 facing the first housing 270 may be provided on the top surface of the light-emitting element 232. There is no particular limitation on the thickness of the metal plate 280. For example, when a metal plate with a thickness of greater than or equal to 10 μm and less than or equal to 200 μm is used, the lighting device can be reduced in weight, which is preferable. There is no particular limitation on a material of the metal plate 280, but it is preferable to use a metal such as aluminum, copper, nickel, a metal alloy such as an aluminum alloy or stainless steel, or the like.

The metal plate 280 and the first housing 270 are bonded with an adhesive layer 281 to seal the light-emitting element 232. For the adhesive layer 281, a visible light curable adhesive, a UV curable adhesive, or a thermosetting adhesive can be used. As examples of materials of such adhesives, an epoxy resin, an acrylic resin, a silicone resin, a phenol resin, and the like are given. A moisture-absorbing substance serving as a drying agent may be contained in the adhesive layer 281.

When the light-emitting element 232 is sealed with the metal plate 280 and the first housing 270, entry of moisture into the light-emitting element 232 can be prevented because the metal plate 280 has low water permeability. Consequently, by providing the metal plate 280, a highly reliable lighting device in which deterioration due to moisture is prevented can be provided.

An inorganic insulating film, a glass substrate, a quartz substrate, or the like may be used instead of the metal plate 280.

A moisture-absorbing substance serving as a drying agent may be provided in a space of the housing 200 where the light-emitting element 232 is provided. The moisture-absorbing substance may be placed as a solid such as a powdery substance or may be provided as a film containing a moisture-absorbing substance over the light-emitting element 232 by a film formation method such as sputtering.

An optical film may be provided on a light emitting surface side of the lighting device 210. For example, in the housing 200, a diffusing film may be provided in a region of the first housing 270, which covers the light emitting surface and is opposite to the light-emitting element 232 side.

FIGS. 10A and 10B are examples of the first housings 241 and 242 each having an uneven shape including a plurality of projections and depressions like a microlens array on a light emitting surface side (a side opposite to the light-emitting element 232). In the lighting device 210, when the first housings 241 and 242 each have an uneven shape including a plurality of projections and depressions on the light emitting surface side, total reflection at the interface between the first housing 241 and the air and between the first housing 242 and the air can be suppressed; thus, the extraction efficiency of light to the outside of the housings can be improved.

The first housing 241 having an uneven shape can be formed using an organic resin as its material. The shape of the organic resin can be processed by heat treatment or light irradiation treatment depending on the characteristics of the organic resin. For example, a support having an uneven shape and serving as a mold of the uneven shape of the housing is prepared, a thermoplastic organic resin is used for the material of the housing, the thermoplastic organic resin is pressed into the support while performing heat treatment so that the shape of the thermoplastic organic resin is changed so as to reflect the shape of the support, and then the thermoplastic organic resin is cured by cooling; thus, the first housing 241 having an uneven shape can be formed.

As a specific example of a member used for the first housing 241, an organic resin (plastic) is given. As plastic, a member made from polycarbonate, polyarylate, polyethersulfone, or the like is given, for example.

FIGS. 13A1, 13A2, 13B1, and 13B2 illustrate cross-sectional views and plan views of the first housing 241 in FIG. 10A. FIGS. 13A2 and 13B2 illustrate examples of plan views of first housings 241a and 241b each having an uneven shape. FIG. 13A1 is a cross-sectional view along line X1-Y1 in FIG. 13A2 and FIG. 13B1 is a cross-sectional view along line X2-Y2 in FIG. 13B2.

The first housing 241a illustrated in FIGS. 13A1 and 13A2 has an uneven shape in which the base of a projection is a circle. The first housing 241b illustrated in FIGS. 13B1 and 13B2 has an uneven shape in which the base of a projection is a regular hexagon. The pitch or the bottom shape of the projections included in the first housing 241 can be set variously and is not limited to the structures in FIGS. 13A1, 13A2, 13B1, and 13B2. For example, an uneven shape including an apex such as a circular cone, a pyramid (e.g., a triangular pyramid or a square pyramid), or the like may be used. Note that it is preferable to employ an uneven shape in which the base of a projection is a regular hexagon, that is, a so-called honeycomb structure as illustrated in FIGS. 13B1 and 13B2 because the density of arrangement of the uneven shape can be improved and the extraction efficiency of light to the outside of the housing can be further improved.

Further, it is also possible to use the first housing 242 having an uneven shape including a plurality of projections and depressions like a microlens array on both the light emitting surface side (the side opposite to the, light-emitting element 232) and the light-emitting element 232 side, as illustrated in FIG. 10B.

The first housing 242 illustrated in FIG. 10B has uneven shapes each including a plurality of projections and depressions on both sides. Further, in FIG. 10B, the uneven shapes including a plurality of projections and depressions provided on the light-emitting element 232 side overlap with the light-emitting element 232. A high refractive index material layer 234 is provided in a region of the first housing 242, having the uneven shape on the light-emitting element 232 side, so as to be in contact with the uneven shape. Note that the uneven shape provided on the first housing 242 is arranged in a stripe shape, which is effective, but is preferably arranged in a matrix shape.

The first housing 242 illustrated in FIG. 10B has the uneven shape including a plurality of projections and depressions on the light emitting side of the first housing 242, whereby total reflection at the interface between the first housing 242 and the air can be suppressed. Moreover, the uneven shape including a plurality of projections and depressions is provided between the first housing 242 and the high refractive index material layer 234, whereby total reflection at the interface between the high refractive index material layer 234 and the first housing 242 can be suppressed and the extraction efficiency of light to the outside of the housing can be further improved.

As examples of the material that can be used for the first housing 242, glass, a resin, and the like whose refractive index is greater than 1.0 and less than 1.6 are given. As the resin, a polyester resin, a polyacrylonitrile resin, a polyimide resin, a polymethyl methacrylate resin, a polycarbonate resin, a polyethersulfone resin, a polyamide resin, a cycloolefm resin, a polystyrene resin, a polyamide imide resin, a polyvinylchloride resin, or the like can be used. In particular, a material whose refractive index is greater than or equal to 1.4 and less than 1.6 is preferably used.

As a method for forming an uneven shape in the above material, for example, etching, sand blasting, microblast processing, droplet discharge, printing (screen printing or offset printing by which a pattern is formed), coating such as spin coating, dipping, dispenser, imprint, nanoimprint, or the like can be used as appropriate.

The high refractive index material layer 234 is formed of high refractive index glass, a liquid, or a resin. The high refractive index material layer 234 has a light-transmitting property and the refractive index is greater than or equal to 1.6, preferably greater than or equal to 1.7 and less than or equal to 2.1. As examples of a resin with a high refractive index, a resin containing bromine, a resin containing sulfur, and the like are given. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used. As a liquid with a high refractive index, a contact liquid (refractive liquid) containing sulfur and methylene iodide, or the like can be used. Any of a variety of methods suitable for the material may be employed for forming the high refractive index material layer 234. For example, the above resin is selectively formed in contact with the uneven shape including a plurality of projections and depressions provided on the light-emitting element 232 side of the first housing 242 by spin coating and is cured by heat or light, so that the high refractive index material layer 234 can be formed. The material and the film formation method can be selected as appropriate in consideration of the adhesion strength, ease of processing, or the like. Note that the high refractive index material layer 234 also functions as a planarization film for the uneven shape including a plurality of projections and depressions provided on the light-emitting element 232 side of the first housing 242.

In general, a resin with a high refractive index is expensive, but in the lighting device illustrated in FIG. 10B, the high refractive index material layer 234 may be selectively formed in a region overlapping with the light-emitting element 232 and in contact with the uneven shape including a plurality of projections and depressions, and the thickness of the high refractive index material layer 234 is several tens of micrometers, which is small. Therefore, a lighting device with high extraction efficiency of light can be manufactured at low cost.

The size and height of the projection of the uneven shape on the side which is in contact with the high refractive index material layer 234 is preferably about 0.1 μm to 100 μm. The size and height of the projection on the opposite side is preferably about 0.1 μm to 1000 μm. The size of the uneven shape on the side which is in contact with the high refractive index material layer 234 affects the amount of material used for the high refractive index material layer 234, which narrows the allowable range of the size and height of the projection. In contrast, the uneven shape on the opposite side may have a size or height exceeding 1000 μm. In particular, the uneven shapes on the both sides preferably have the size and height of greater than or equal to 1 μm, in which case influence of interference of light can be reduced.

Further, in FIG. 10B, an inorganic insulating film 235 is provided between the light-emitting element 232 and the first housing 242. When a nitride film with a refractive index greater than or equal to 1.6 is used as the inorganic insulating film 235, diffusion of impurities to the light-emitting element can be prevented without a decrease in the extraction efficiency of light, which is preferable.

In a lighting device of this embodiment, a terminal electrode provided on a housing so as to expose to the outside is in contact with a terminal electrode for an external power supply, so that the external power supply and a light-emitting element are electrically connected to each other and thus, the lighting device can be supplied with power. Therefore, the lighting device and the external power supply can be more easily connected to each other and the convenience of the lighting device can be improved.

This embodiment can be implemented in appropriate combination with the structures described in the other embodiments.

(Embodiment 2)

In this embodiment, examples of the lighting device in Embodiment 1 provided with auxiliary wirings are described with reference to FIG. 11 and FIGS. 12A and 12B. That is, except the absence of auxiliary wirings, the lighting device can be formed in a manner similar to Embodiment 1; thus, repetitive description of the same components or components having similar functions as in Embodiment 1 and manufacturing steps for forming those components will be omitted.

Figure 11:
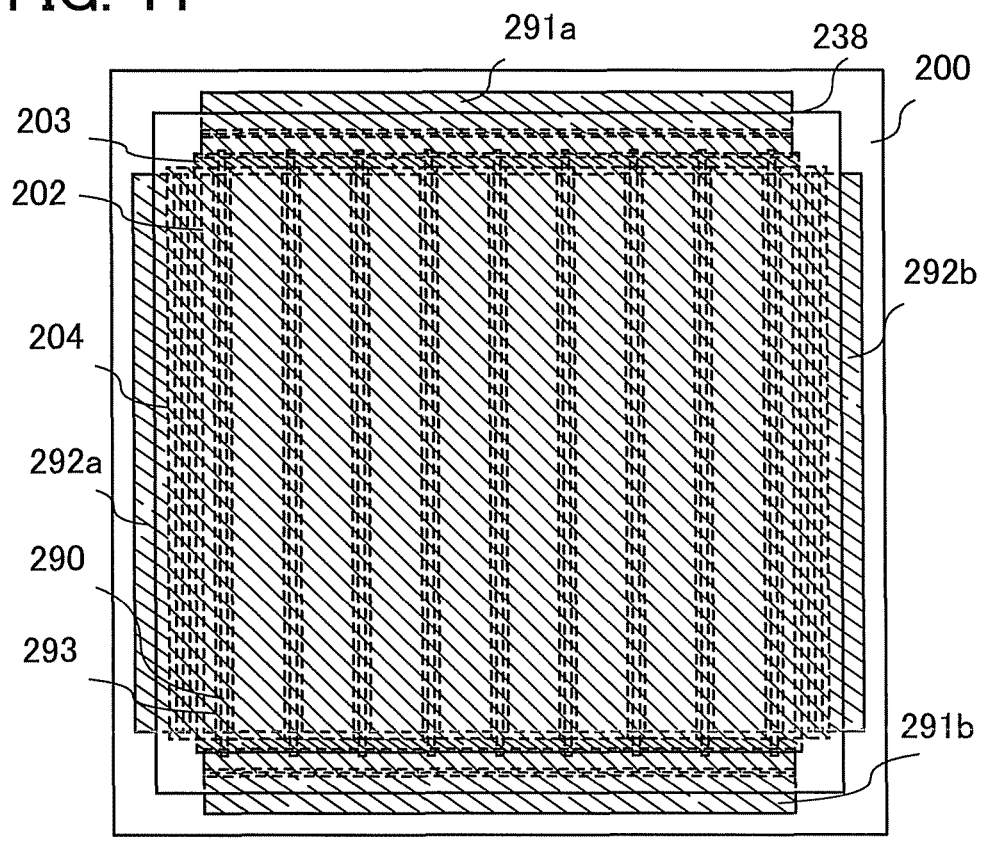
FIG. 11 is a plan view illustrating a lighting device.
Figure 12A:
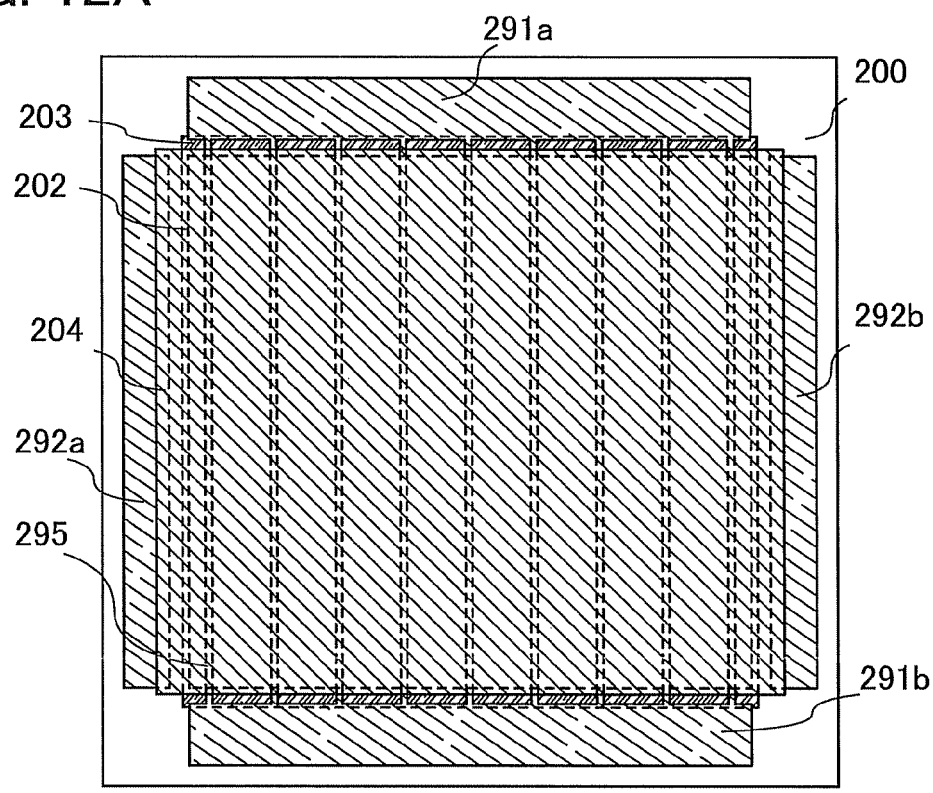
FIGS. 12A and 12B are plan views each illustrating a lighting device.
Figure 12B:
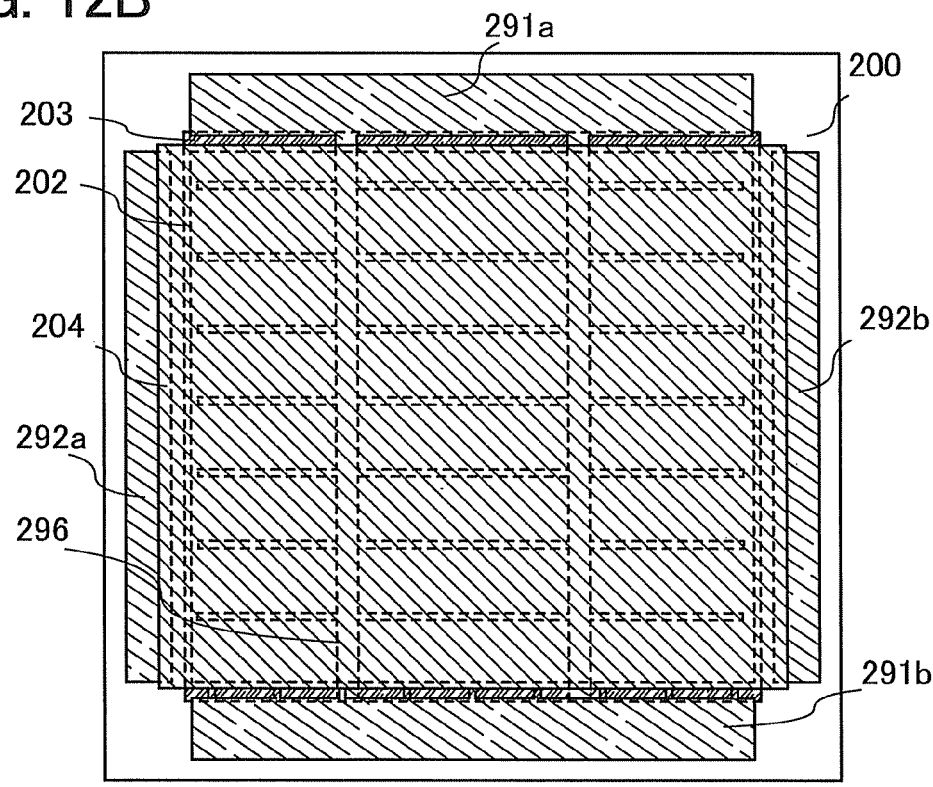

Note that FIG. 11 and FIGS. 12A and 12B are plan views of the lighting device and a terminal electrode provided on the housing 200 and the connection of the terminal electrode and the light-emitting element are omitted.

In FIG. 11, auxiliary wirings 290 arranged in a stripe shape are provided between the first electrode 202 and the EL layer 203 as auxiliary wirings of the light-emitting element provided in the housing 200. An insulating layer 293 is provided over the auxiliary wirings 290 so as to cover the auxiliary wirings 290 in order to prevent a short circuit between the auxiliary wirings 290 and the second electrode 204. Further, an inorganic insulating film 238 is provided over the second electrode 204 so as to cover the light-emitting element.

FIG. 11 and FIGS. 12A and 12B each illustrate an example of connecting the first electrode 202 and the second electrode 204 to the terminal electrode provided on the housing 200 through extraction terminals 291a and 291b and extraction terminals 292a and 292b, respectively.

The first electrode 202 is electrically connected to the extraction terminals 291a and 291b through the auxiliary wirings 290. The second electrode 204 is electrically connected to the extraction terminals 292a and 292b. By providing a plurality of extraction terminals or an extraction terminal with a large area as in this embodiment, a voltage drop can be prevented.

FIGS. 12A and 12B show examples of the shape of the auxiliary wirings. Auxiliary wirings 295 in FIG. 12A are formed using a conductive film which is continuous with the extraction terminals 291a and 291b. The auxiliary wirings 295 are formed in contact with the first electrode 202 and have a stripe shape. Auxiliary wirings 296 in FIG. 12B are also formed using a conductive film which is continuous with the extraction terminals 291a and 291b. The auxiliary wirings 296 have a grid shape (a vein shape) and have regions with thick line width and regions with thin line width.

For the auxiliary wirings 290, 295, and 296, a conductive material is used. For example, the auxiliary wirings 290, 295, and 296 can have a single-layer structure or a layered structure of a material such as aluminum (Al), titanium (Ti), tantalum (Ta), tungsten (W), molybdenum (Mo), chromium (Cr), neodymium (Nd), scandium (Sc), nickel (Ni), or copper (Cu); or an alloy material including any of these materials as its main component. Alternatively, the auxiliary wirings 290, 295, and 296 may be formed using a conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Any of the auxiliary wirings 290, 295, and 296 may be provided between the housing 200 and the first electrode 202. Any of the auxiliary wirings 290, 295, and 296 may be arranged in a depression portion (a groove portion) provided in the housing 200.

The depression portion of the housing 200 can be formed at the same time when an organic resin is processed using a support serving as a mold to have an uneven shape. Needless to say, the depression portion may be formed in the housing 200 by etching through another process.

An inorganic insulating film may be formed over the housing 200 having a depression portion and auxiliary wirings may be formed over the inorganic insulating film so as to fill the depression portion of the housing 200.

A conductive film is formed by sputtering, evaporation, or coating and selectively removed, whereby each of the auxiliary wirings 290, 295, and 296 can be formed.

Further, the auxiliary wirings 290, 295, and 296 may be selectively formed by inkjet, printing, or the like. For example, in the case of forming the auxiliary wirings 290, 295, and 296 by printing, the auxiliary wirings 290, 295, and 296 can be formed by selective printing of a conductive paste in which conductive particles having grain diameter of several nanometers to several tens of micrometers are dissolved or dispersed in an organic resin. As the conductive particles, at least one of metal particles of silver (Ag), gold (Au), copper (Cu), nickel (Ni), platinum (Pt), palladium (Pd), tantalum (Ta), molybdenum (Mo), titanium (Ti), and the like or fine particles of silver halide can be used. In addition, as the organic resin included in the conductive paste, one or more selected from organic resins functioning as a binder of metal particles, a solvent, a dispersing agent and a coating material can be used. An organic resin such as an epoxy resin or a silicone resin can be given as a typical example. Further, in forming the conductive layer, it is preferable to bake the conductive paste after being extruded. Further, fine particles containing solder or lead-free solder as its main component may be used. Note that the conductive paste can be used for a conductive layer which electrically connects the light-emitting element 232 and the terminal electrode provided on the housing 200.

The power consumption of the lighting device can be reduced by providing the auxiliary wiring.

In a lighting device of this embodiment, a terminal electrode provided on a housing so as to expose to the outside is in contact with a terminal electrode for an external power supply, so that the external power supply and a light-emitting element are electrically connected to each other and thus, the lighting device can be supplied with power. Therefore, the lighting device and the external power supply can be more easily connected to each other and the convenience of the lighting device can be improved.

This embodiment can be implemented in appropriate combination with the structures described in the other embodiments.

(Embodiment 3)

In this embodiment, an example of an element structure of a light-emitting element included in a lighting device which is one embodiment of the present invention is described.

Figure 7A:
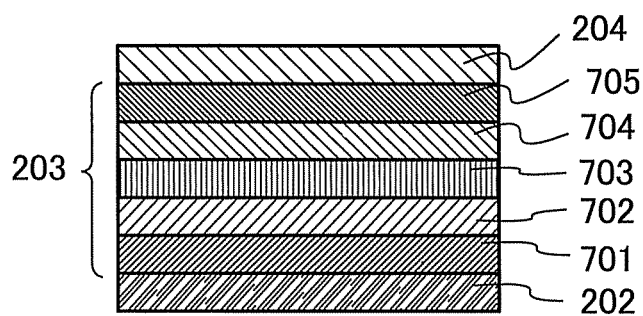
FIGS. 7A to 7C each illustrate an example of a light-emitting element which can be used for a lighting device.

A light-emitting element illustrated in FIG. 7A includes the first electrode 202, the EL layer 203 over the first electrode 202, and the second electrode 204 over the EL layer 203.

The EL layer 203 may include at least a light-emitting layer containing a light-emitting organic compound. In addition, the EL layer 203 can have a layered structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, in the EL layer 203, a hole-injection layer 701, a hole-transport layer 702, a light-emitting layer 703, an electron-transport layer 704, and an electron-injection layer 705 are stacked in this order from the first electrode 202 side.

A manufacturing method of the light-emitting element illustrated in FIG. 7A will be described.

First, the first electrode 202 is formed. The first electrode 202 is provided in the direction in which light is extracted from the EL layer, and thus is formed using a light-transmitting material.

As the light-transmitting material, indium oxide, indium tin oxide (also referred to as ITO), indium zinc oxide (also referred to as IZO), zinc oxide, zinc oxide to which gallium is added, graphene, or the like can be used.

In addition, as the first electrode 202, a metal material such as gold, platinum, nickel, tungsten, chromium, molybdenum, iron, cobalt, copper, palladium, or titanium can be used. Further, a nitride of the metal material (such as titanium nitride) or the like may be used. In the case of using the metal material (or the nitride thereof), the first electrode 202 may be thinned so as to be able to transmit light.

Next, the EL layer 203 is formed over the first electrode 202. In this embodiment, the EL layer 203 includes the hole-injection layer 701, the hole-transport layer 702, the light-emitting layer 703, the electron-transport layer 704, and the electron-injection layer 705.

The hole-injection layer 701 is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$), or copper(II) phthalocyanine (abbreviation: CuPc) can also be used.

Alternatively, the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, high molecular compounds (e.g., oligomers, dendrimers, or polymers) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N-bis(4-butylphenyl)-N,N-bis(phenyl)benzidine (abbreviation: Poly-TPD). In addition, a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can be used.

In particular, for the hole-injection layer 701, a composite material in which an acceptor substance is contained in an organic compound having a high hole-transport property is preferably used. With the use of the composite material in which an acceptor substance is contained in a substance having a high hole-transport property, hole injection from the first electrode 202 is favorable, which leads to a reduction in the driving voltage of the light-emitting element. Such a composite material can be formed by co-depositing a substance having a high hole-transport property and a substance having an acceptor property. The hole-injection layer 701 is formed using the composite material, whereby hole injection from the first electrode 202 to the EL layer 203 is facilitated.

As the organic compound for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ cm$^2$/Vs or higher is preferably used. Note that a substance other than the above substances may also be used as long as it has a higher hole-transport property than an electron-transport property. The organic compounds which can be used for the composite material will be specifically shown below.

Examples of the organic compounds that can be used for the composite material include: aromatic amine compounds such as TDATA, MTDATA, DPAB, DNTPD, DPA3B, PCz-PCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-diphenyl-[1,1'-biphenyl]-4, 4'-diamine (abbreviation: TPD) 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

In addition, it is possible to use the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, or the like.

Moreover, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

Further, as the electron acceptor, organic compounds such as 7,7,8,8-tetracyano-2,3,5,6-tetrafluoroquinodimethane (abbreviation: F$_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

The composite material may be formed using the above described electron acceptor and the above described high molecular compound such as PVK, PVTPA, PTPDMA, or Poly-TPD and used for the hole-injection layer 701.

The hole-transport layer 702 is a layer which contains a substance having a high hole-transport property. As the substance having a high hole-transport property, any of the following aromatic amine compounds can be used, for example: NPB; TPD; BPAFLP; 4,4'-bis[N-(9,9-dimethylfluoren-2-yl)-N-phenylamino]biphenyl (abbreviation: DFLDPBi); and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/Vs or higher. Note that a substance other than the above substances may also be used as long as it has higher a hole-transport property than an electron-transport property. The layer containing a substance having a high hole-transport property is not limited to a single layer, and two or more layers containing the aforementioned substances may be stacked.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can be used.

The light-emitting layer 703 is a layer containing a light-emitting organic compound. As the light-emitting organic compound, for example, a fluorescent compound which exhibits fluorescence or a phosphorescent compound which exhibits phosphorescence can be used.

The fluorescent compounds that can be used for the light-emitting layer 703 are given below. Examples of the materials that emit blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N- phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of materials that emit red light include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

The phosphorescent compounds that can be used for the light-emitting layer 703 will be given. Examples of the materials that emit blue light include bis[2-(4',6'-difluorophenyl)pyridinato-N,C$^{2'}$]iridium(III)tetrakis(1-pyrazolyl)borate (abbreviation: FIr6), bis[2-(4',6'-difluorophenyppyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), and the like. Examples of the materials that emit green light include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the materials that emit red light include: bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), (2,3,7,8,12,13,17,18-octaethyl-21H,23H-porphyrin)platinum(II) (abbreviation: PtOEP), and the like. In addition, a rare earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) exhibits light emission from a rare earth metal ion (electron transition between different multiplicities); therefore, such a rare earth metal complex can be used as a phosphorescent compound.

Note that the light-emitting layer 703 may have a structure in which the above light-emitting organic compound (a guest material) is dispersed in another substance (a host material). As a host material, various kinds of materials can be used, and it is preferable to use a substance which has a lowest unoccupied molecular orbital level (LUMO level) higher than a light-emitting substance and has a highest occupied molecular orbital level (HOMO level) lower than that of a light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-{4-[4-(10-phenyl-9-anthryl)phenyl]henyl}-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization, may be further added. In addition, NPB, Alq, or the like may be further added in order to efficiently transfer energy to the guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, examples of the materials that emit blue light include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation:

TAB-PFH), and the like. Examples of the materials that emit green light include poly(p-phenylenvinylene) (abbreviation: PPV), poly[(9,9-dihexylfluorene-2,7-diyl)-alt-co-(benzo[2,1,3]thiadiazol-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], or the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

The light-emitting layer may have a stacked-layer structure including two or more layers. When the light-emitting layer has a stacked-layer structure of two or more layers and the kind of light-emitting substance for each light-emitting layer is changed, various emission colors can be obtained. In addition, a plurality of light-emitting substances with different emission colors is used as the light-emitting substance, whereby light emission having a broad spectrum or white light emission can also be obtained. In particular, for a lighting device in which high luminance is required, a structure in which light-emitting layers are stacked is preferable.

The electron-transport layer 704 is a layer which contains a substance having a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/Vs or higher. Furthermore, the electron transport layer is not limited to a single layer, and two or more layers made of the aforementioned substances may be stacked.

The electron-injection layer 705 is a layer that contains a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of the above substances for forming the electron-transport layer 704 can also be used.

Note that the hole-injection layer 701, the hole-transport layer 702, the light-emitting layer 703, the electron-transport layer 704, and the electron-injection layer 705 which are described above can each be formed by a method such as evaporation (e.g., vacuum evaporation), inkjet, or coating.

Figure 7B:
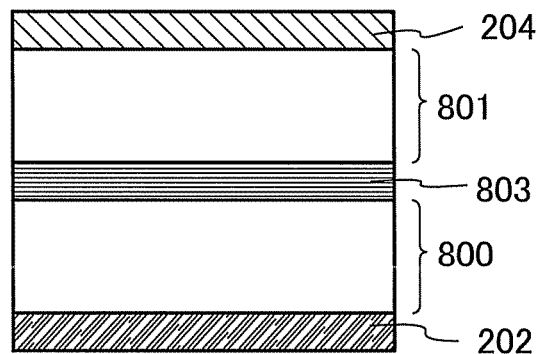

Note that a plurality of EL layers may be stacked between the first electrode 202 and the second electrode 204 as illustrated in FIG. 7B. In that case, a charge generation layer 803 is preferably provided between a first EL layer 800 and a second EL layer 801 which are stacked. The charge generation layer 803 can be formed of the above-mentioned composite material. Further, the charge generation layer 803 may have a stacked structure including a layer containing the composite material and a layer containing another material. In that case, as the layer containing another material, a layer containing an electron donating substance and a substance with high electron-transport properties, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained. This structure can be combined with the above-mentioned structures of the EL layer.

When the charge generation layer 803 is provided between the stacked EL layers as illustrated in FIG. 7B, the element can have high luminance and a long lifetime while the current density is kept low. In addition, the voltage drop due to resistance of the electrode material can be reduced, whereby uniform light emission in a large area is possible.

In the case where an EL layer is a stacked-type element having two stacked layers, white light emission can be obtained by allowing a first EL layer and a second EL layer to emit light of complementary colors. Note that white light emission can also be obtained with a structure in which the first EL layer and the second EL layer each include a plurality of light-emitting layers that emit light with colors complementary to each other. As a complementary relation, blue and yellow, blue green and red, and the like are given. A substance which emits light of blue, yellow, blue green, or red may be selected as appropriate from, for example, the light-emitting substances given above.

An example of a light-emitting element having a structure in which a plurality of EL layers is stacked is described below. First, an example of a structure in which each of the first EL layer and the second EL layer includes a plurality of light-emitting layers emitting light of complementary colors is described. With this structure, white light emission can be obtained.

For example, the first EL layer includes a first light-emitting layer exhibiting an emission spectrum having a peak in the wavelength range of blue to blue green, and a second light-emitting layer exhibiting an emission spectrum having a peak in the wavelength range of yellow to orange. The second EL layer includes a third light-emitting layer exhibiting an emission spectrum having a peak in the wavelength range of blue green to green, and a fourth light-emitting layer exhibiting an emission spectrum having a peak in the wavelength range of orange to red.

In that case, light emission from the first EL layer is a combination of light emission from both the first light-emitting layer and the second light-emitting layer and thus exhibits an emission spectrum having peaks both in the wavelength range of blue to blue green and in the wavelength range of yellow to orange. That is, the first EL layer emits light of two-wavelength white color or almost white color.

Further, light emission from the second EL layer is a combination of light emission from both the third light-emitting layer and the fourth light-emitting layer and thus exhibits an emission spectrum having peaks both in the wavelength range of blue green to green and in the wavelength range of orange to red. That is, the second EL layer exhibits light emission which has a two-wavelength white color or almost white color, which is different from the first EL layer.

Therefore, by combining the light-emission from the first EL layer and the light emission from the second EL layer, white light emission covering the wavelength range of blue to blue green, the wavelength range of blue green to green, the wavelength range of yellow to orange, and the wavelength range of orange to red can be obtained.

In addition, since the wavelength range of yellow to orange (greater than or equal to 560 nm and less than 580 nm) is a wavelength range of high spectral luminous efficacy, it is effective to use an EL layer including a light-emitting layer whose emission spectrum peak is in the wavelength range of yellow to orange. For example, a structure in which the a first EL layer including a light-emitting layer having an emission spectrum peak in the blue wavelength range, a second EL layer including a light-emitting layer having an emission spectrum peak in the yellow wavelength range, and a third EL layer including a light-emitting layer having an emission spectrum peak in the red wavelength range are stacked can be used.

Alternatively, two or more EL layers exhibiting yellow to orange may be stacked. By stacking two or more EL layers exhibiting yellow to orange, the power efficiency of the light-emitting element can be further improved.

For example, in the case of a light-emitting element in which three EL layers are stacked, a structure can be used in which a second EL layer and a third EL layer each including a light-emitting layer having an emission spectrum peak in the wavelength range of yellow to orange are stacked over a first EL layer including a light-emitting layer having an emission spectrum peak in the blue wavelength range (greater than or equal to 400 nm and less than 480 nm). Note that the wavelength of the peak of the emission spectrum from the second EL layer may be the same as or different from that from the third EL layer.

The use of an EL layer having an emission spectrum peak in the wavelength range of yellow to orange makes it possible to utilize the wavelength range of high luminosity and to improve power efficiency. For this reason, the power efficiency of the whole light-emitting element can be increased. Such a structure is advantageous in terms of spectral luminous efficacy and can improve power efficiency in comparison with the case where, for example, an EL layer emitting green light and an EL layer emitting red light are stacked to obtain a light-emitting element which emits yellow to orange light. Further, the emission intensity of light of the blue wavelength range with low spectral luminous efficacy is relatively low in comparison with the case of using only one EL layer whose emission spectrum peak is the wavelength range of yellow to orange with high luminosity; thus, the color of emitted light is close to light bulb color (or warm white), and the power efficiency is improved.

In other words, in the above light-emitting element, the color of light obtained by combining light whose emission spectrum peak is in the wavelength range of yellow to orange and the wavelength of the peak is greater than or equal to 560 nm and less than 580 nm and light whose emission spectrum peak is in the blue wavelength range (i.e., the color of light emitted from the light-emitting element) can be natural color like warm white or light bulb color. In particular, light bulb color can be easily obtained.

For example, an organometallic complex in which a pyrazine derivative serves as a ligand can be used as the light-emitting substance having a peak in the wavelength range of yellow to orange. Alternatively, the light-emitting layers can be formed by dispersing a light-emitting substance (a guest material) in another substance (a host material). A phosphorescent compound can be used as the light-emitting substance having a peak in the wavelength range of yellow to orange. The power efficiency in the case of using a phosphorescent compound is three to four times as high as that in the case of using a fluorescent compound. The above organometallic complex in which a pyrazine derivative serves as a ligand is a phosphorescent compound, has high emission efficiency, and easily emits light in the wavelength range of yellow to orange, and thus is favorable.

For example, a pyrene diamine derivative can be used as the light-emitting substance which emits light having a peak in the blue wavelength range. A fluorescent compound can be used as the light-emitting substance which emits light having a peak in the blue wavelength range. The use of a fluorescent compound makes it possible to obtain a light-emitting element with lifetime longer than that of a light-emitting element in which a phosphorescent compound is used. The above pyrene diamine derivative is a fluorescent compound, can obtain an extremely high quantum yield, and has a long lifetime, which is preferable.

Figure 7C:
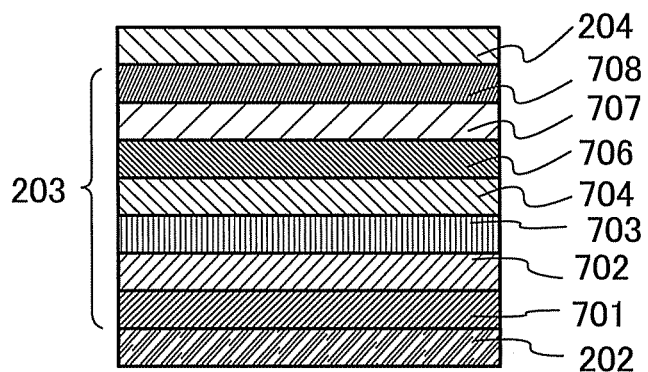

As illustrated in FIG. 7C, the EL layer 203 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 204, between the first electrode 202 and the second electrode 204.

It is preferable to provide the composite material layer 708 which is in contact with the second electrode 204 because damage caused to the EL layer 203 can be reduced particularly when the second electrode 204 is formed by a sputtering method.

For the composite material layer 708, the above-described composite material in which an acceptor substance is mixed with an organic compound having a high hole-transport property can be used.

Moreover, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (including an oxide such as lithium oxide, a halide, or carbonate such as lithium carbonate or cesium carbonate), an alkaline earth metal compound (including an oxide, a halide, or carbonate), or a rare earth metal compound (including an oxide, a halide, or carbonate).

Further, in the case where the electron-injection buffer layer 706 contains a substance having a high electron-transport property and a donor substance, the donor substance is preferably added so that the mass ratio of the donor substance to the substance having a high electron-transport property is greater than or equal to 0.001:1 and less than or equal to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), or a rare earth metal compound (including an oxide, a halide, and carbonate). Note that as the substance having a high electron-injection property, a material similar to the material for the electron transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained, in the composite material layer 708 and the donor substance contained in the electron-injection buffer layer 706 are less likely to interact with each other, and thus their functions hardly interfere with each other. Therefore, an increase in driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor material contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, any of CuPc, phthalocyanine tin(II) complex (SnPc), phthalocyanine zinc complex (ZnPc), cobalt (II) phthalocyanine, n-form (CoPc), phthalocyanine iron (FePc), and vanadyl 2,9,16,23-tetraphenoxy-29H,31H-phthalocyanine (PhO-VOPc) is preferably used.

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex having a metal-oxygen double bond is considered stable. Therefore, the use of the metal complex having the metal-oxygen double bond makes it possible to drive the light-emitting element more stably at low voltage.

For a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. Thus, the phthalocyanine derivative has an advantage of being easily handled during formation of a light-emitting element and an advantage of facilitating maintenance of an apparatus used for deposition.

The electron-relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), or a rare earth metal compound (including an oxide, a halide, and carbonate). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a substance having a LUMO level greater than or equal to −5.0 eV, preferably greater than or equal to −5.0 eV and less than or equal to −3.0 eV is preferably used. As examples of such a substance, a perylene derivative and a nitrogen-containing condensed aromatic compound are given. Note that a nitrogen-containing condensed aromatic compound is preferably used for the electron-relay layer 707 because of its stability.

As specific examples of the perylene derivative, the following are given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4, 9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following are given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl) pyrido[2,3-b]pyrazine (abbreviation: F2PYPR), and the like.

Besides, 7,7,8,8-tetracyanoquinodimethane (abbreviation: TCNQ), 1,4,5 ,8-naphthalenetetracarboxylicdianhydride (abbreviation: NTCDA), perfluoropentacene, copper hexadecafluoro phthalocyanine (abbreviation: F$_{16}$CuPc), N,N'-bis (2,2,3,3,4,4,5,5,6,6,7,7,8,8,8-pentadecalluorooctyl-1,4,5,8-naphthalenetetracarb oxylic diimide (abbreviation: NTCDI-C8F), 3',4'-dibutyl-5,5"-bis(dicyanomethylene)-5, 5" -dihydro-2,2':5',2"-terthiophen) (abbreviation: DCMT), methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may be each formed using any of the above-described materials.

Then, the second electrode 204 is formed over the EL layer 203.

The second electrode 204 is provided opposite to the side where light is extracted and is formed using a reflective material. As the reflective material, a metal material such as aluminum, gold, platinum, silver, nickel, tungsten, chromium, molybdenum; iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given. The above materials are preferable, because they are present in large amounts in the Earth's crust and inexpensive to achieve a reduction in the cost of manufacturing a light-emitting element.

Note that this embodiment can be freely combined with the other embodiments.

(Embodiment) 4

In this embodiment, application examples of a lighting device will be described.

Figure 8:
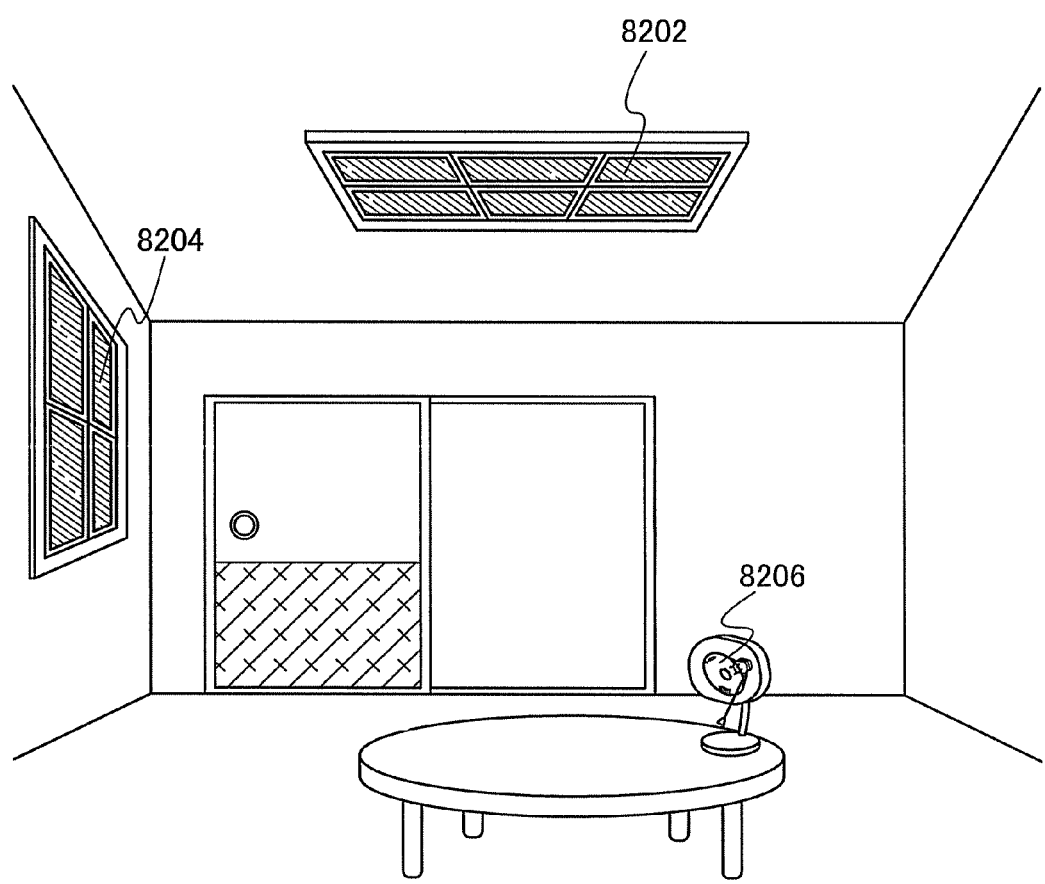
FIG. 8 is a diagram illustrating examples of application of a lighting device.

FIG. 8 illustrates an example of using the lighting device of one embodiment of the present invention as an indoor lighting device. The lighting device of one embodiment of the present invention can be used not only as a ceiling-mounted lighting device 8202, but also as a wall-mounted lighting device 8204. In addition, the lighting device can be used as a desk lamp 8206. Since the lighting device of one embodiment of the present invention has a planar light source, the number of components like a light-reflecting plate can be small compared to the case of using a point light source, or heat generation is less compared to a filament bulb. Therefore, it is preferable to use the lighting device of one embodiment of the present invention as an indoor lighting device.

Next, FIGS. 9A to 9D illustrate examples of using the lighting device of one embodiment of the present invention as a guide light, and the like.

Figure 9A:
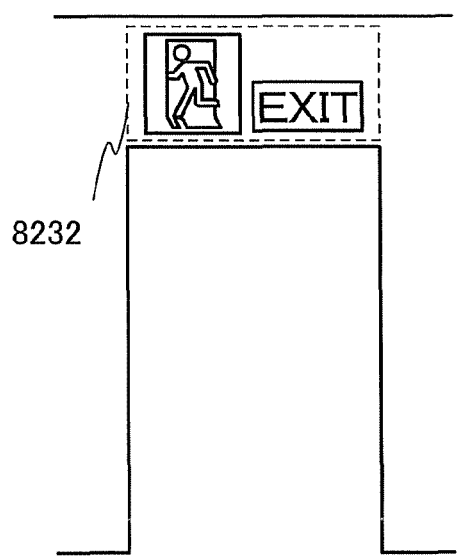
FIGS. 9A to 9D each illustrate an example of application of a lighting device.

FIG. 9A illustrates an example where the lighting device of one embodiment of the present invention is used as an emergency exit light.

FIG. 9A illustrates an external view of the emergency exit light as an example. An emergency exit light 8232 has a structure of a combination of the lighting device and a fluorescent plate provided with a fluorescent portion. Alternatively, the evacuation light 8232 may have a structure of a combination of a lighting device which emits a specific color and a light-shielding plate provided with a light-transmitting portion having a shape as illustrated. The lighting device of one embodiment of the present invention can emit light with a constant luminance, and thus is preferably used as an emergency exit light that needs to be on at all times.

Figure 9B:
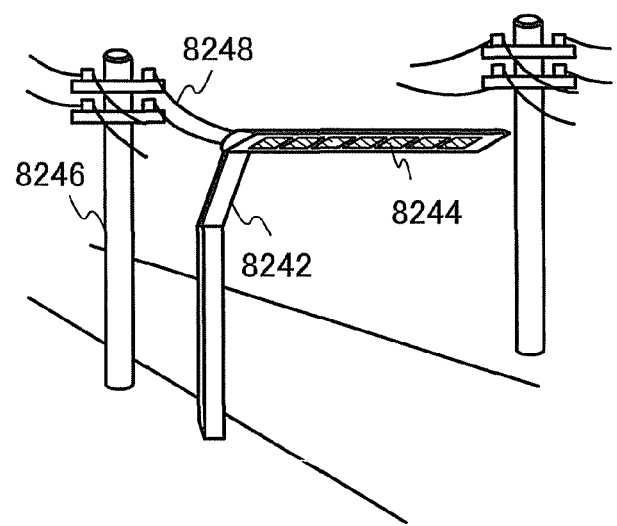

FIG. 9B illustrates an example of using the lighting device of one embodiment of the present invention as an outdoor light.

As an example of an outdoor light, a street light is given. For example, a street light can include a housing 8242 and a lighting portion 8244 as illustrated in FIG. 9B. A plurality of lighting devices of one embodiment of the present invention can be arranged in the lighting portion 8244 to be used. As illustrated in FIG. 9B, for example, a street light is provided along a street and the lighting portion 8244 can light up a space around it, so that visibility of the space around it including a street can be improved.

Note that when power supply voltage is supplied to the street light, power supply voltage can be supplied through a power line 8248 of a utility shaft 8246 as illustrated in FIG. 9B, for example. However, this embodiment is not limited to this and the housing 8242 is provided with a photoelectric conversion device and voltage obtained by the photoelectric conversion device can be used as power supply voltage, for example.

Figure 9C:
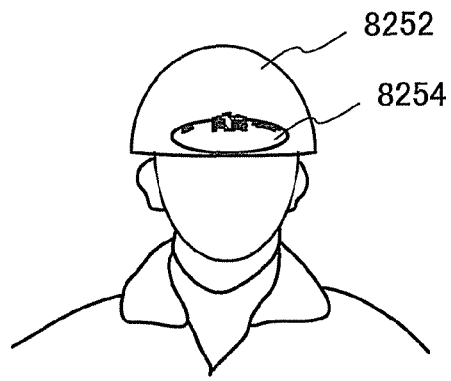
Figure 9D:
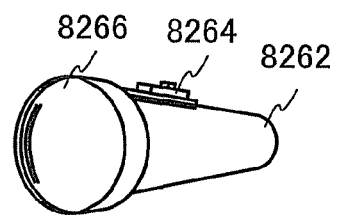

FIGS. 9C and 9D illustrate examples of using the lighting device of one embodiment of the present invention as a portable light. FIG. 9C illustrates a structure of a wearable light and FIG. 9D illustrates a structure of a handheld light.

The wearable light illustrated in FIG. 9C includes an applied portion 8252 and a lighting portion 8254, and the lighting portion 8254 is fixed to the applied portion 8252. The lighting device of one embodiment of the present invention can be used for the lighting portion 8254. In the wearable light illustrated in FIG. 9C, the lighting portion 8254 can emit light while the applied portion 8252 is attached to the head. Further, with the use of a planar light source as the lighting portion 8254, visibility of a space around it can be improved. Furthermore, since the lighting portion 8254 is lightweight, burden when the applied portion 8252 is mounted on the head can be reduced.

Note that the structure of the wearable light is not limited to that illustrated in FIG. 9C, and for example, the following structure can be employed: the applied portion 8252 is formed as a ring belt of flat braid or elastic braid, the lighting portion 8254 is fixed to the belt, and the belt is directly tied around the head.

The handheld light illustrated in FIG. 9D includes a housing 826, a lighting portion 8266, and a switch 8264. The lighting device of one embodiment of the present invention can be used for the lighting portion 8266. When the lighting device of one embodiment of the present invention is used for the lighting portion 8266, the thickness of the lighting portion 8266 can be reduced, and thus the size of the handheld light can be reduced, which makes it easy for the handheld light to be carried around.

The switch 8264 has a function of controlling light emission and non-light emission of the lighting portion 8266. In addition, the switch 8264 can have a function of adjusting luminance of the lighting portion 8266 in light emission, for example.

The handheld light illustrated in FIG. 9D can light up a space around it by emitting light from the lighting portion 8266 with the switch 8264, whereby visibility of the space around it can be improved. Furthermore, since the lighting device of one embodiment of the present invention has a planar light source, the number of components like a light-reflecting plate can be small compared to the case of using a point light source.

Note that what is described in this embodiment with reference to each drawing can be freely combined or replaced with what is described in other embodiments as appropriate.

This application is based on Japanese Patent Application serial no. 2010-235089 filed with Japan Patent Office on Oct. 20, 2010, the entire contents of which are hereby incorporated by reference.

What is claimed is:

1. A lighting device comprising:
  a holding member; and
  a housing including:
    a first housing portion comprising:
      a first surface that is a bottom surface of the first housing portion; and
      a second surface being in an opposite side of the first surface;
    a second housing portion over the first housing portion;
    a first terminal electrode in direct contact with a first peripheral end portion of the second housing portion, the first terminal electrode being surrounded by the first peripheral end portion of the second housing portion;
    a second terminal electrode in direct contact with a second peripheral end portion of the second housing portion, the second terminal electrode being surrounded by the second peripheral end portion of the second housing portion;
    a light-emitting element between the first housing portion and the second housing portion, the light-emitting element comprising:
      a first electrode electrically connected to the first terminal electrode, wherein a thickness direction of the first electrode is substantially perpendicular to the first surface;
      a second electrode over the first electrode, the second electrode being electrically connected to the second terminal electrode; and
      an EL layer between the first electrode and the second electrode;
    an adhesive layer over and in direct contact with the second electrode; and
    a metal layer over and in direct contact with the adhesive layer,
  wherein at least a part of the metal layer completely overlaps with the EL layer,
  wherein at least one of the first housing portion and the second housing portion, that covers a light emitting side of the light-emitting element has a light-transmitting property,
  wherein at least one of the first electrode and the second electrode, that is provided in the light emitting side of the light-emitting element has a light-transmitting property,
  wherein the housing is capable of being fixed in the holding member,
  wherein each of the first terminal electrode and the second terminal electrode is electrically connectable with its respective terminal electrode of the holding member by contacting with the respective terminal electrode,
  wherein the shape of the housing is a rectangular solid and the first terminal electrode and the second terminal electrode are in direct contact with a side surface of the rectangular solid,
  wherein the side surface of the rectangular solid is substantially perpendicular to the first surface,
  wherein an exposed surface of the first terminal electrode is substantially flush with the side surface of the rectangular solid,
  wherein an exposed surface of the second terminal electrode is substantially flush with the side surface of the rectangular solid, and
  wherein the terminal electrode of the holding member includes an elastic material.

2. The lighting device according to claim 1, wherein the first electrode is electrically connected to the first terminal electrode through a first electrode extraction terminal and the second electrode is electrically connected to the second terminal electrode through a second electrode extraction terminal.

3. The lighting device according to claim 1, wherein a plurality of first terminal electrodes and a plurality of second terminal electrodes are provided.

4. The lighting device according to claim 1,
  wherein the adhesive layer is in direct contact with all a side surface of the second electrode, and
  wherein the side surface of the second electrode is substantially perpendicular to the first surface.

5. The lighting device according to claim 1, wherein a part of the housing covering a light emitting surface of the light-emitting element has an uneven shape including a plurality of projections and depressions on a surface opposite to the light-emitting element.

6. The lighting device according to claim 1, wherein a plurality of EL layers is provided with an intermediate layer interposed therebetween.

7. A lighting device comprising:
  a holding member; and
  a housing including:
    a first housing portion comprising:
      a first surface that is a bottom surface of the first housing portion; and
      a second surface being in an opposite side of the first surface;
    a second housing portion over the first housing portion;
    a first terminal electrode in direct contact with a first peripheral end portion of the second housing portion, the first terminal electrode being surrounded by the first peripheral end portion of the second housing portion;
    a second terminal electrode in direct contact with a second peripheral end portion of the second housing portion, the second terminal electrode being surrounded by the second peripheral end portion of the second housing portion;
    a third terminal electrode electrically connected to a sensor element;
    a fourth terminal electrode electrically connected to the sensor element;
    a light-emitting element between the first housing portion and the second housing portion, the light-emitting element comprising:
      a first electrode electrically connected to the first terminal electrode, wherein a thickness direction of the first electrode is substantially perpendicular to the first surface;
      a second electrode over the first electrode, the second electrode being electrically connected to the second terminal electrode; and
      an EL layer between the first electrode and the second electrode;
    an adhesive layer over and in direct contact with the second electrode;
    a metal layer over and in direct contact with the adhesive layer; and
    a resin in direct contact with a top surface of the metal layer and side surfaces of the metal layer,
  wherein at least a part of the metal layer completely overlaps with the EL layer, wherein at least one of the first housing portion and the second housing portion, that covers a light emitting side of the light-emitting element has a light-transmitting property, wherein at least one of the first electrode and the second electrode, that is provided in the light emitting side of the light-emitting element has a light-transmitting property, wherein the housing is capable of being fixed in the holding member, wherein each of the first terminal electrode, the second terminal electrode, the third terminal electrode, and the fourth terminal electrode is electrically connectable with its respective terminal electrode of the holding member by contacting with the respective terminal electrode, wherein the shape of the housing is a rectangular solid comprising:
the first surface that is a bottom surface of the rectangular solid;
a third surface that is a top surface of the rectangular solid;
a fourth surface that is a first side surface of the rectangular solid;
a fifth surface that is a second side surface of the rectangular solid;
a sixth surface that is a third side surface of the rectangular solid; and
a seventh surface that is a fourth side surface of the rectangular solid, wherein each of the first terminal electrode and the second terminal electrode is in direct contact with the fourth surface, wherein each of the first terminal electrode and the second terminal electrode is not in direct contact with any of the first surface, the third surface, the fifth surface, the sixth surface and the seventh surface, wherein the fourth surface is substantially perpendicular to the first surface, wherein an exposed surface of the first terminal electrode is substantially flush with the fourth surface, wherein an exposed surface of the second terminal electrode is substantially flush with the fourth surface, and wherein the terminal electrode of the holding member includes an elastic material.

8. The lighting device according to claim 7, wherein the first electrode is electrically connected to the first terminal electrode through a first electrode extraction terminal and the second electrode is electrically connected to the second terminal electrode through a second electrode extraction terminal.

9. The lighting device according to claim 7, wherein a plurality of first terminal electrodes and a plurality of second terminal electrodes are provided.

10. The lighting device according to claim 7,
wherein the adhesive layer is in direct contact with all a side surface of the second electrode, and
wherein the side surface of the second electrode is substantially perpendicular to the first surface.

11. The lighting device according to claim 7, wherein a part of the housing covering a light emitting surface of the light-emitting element has an uneven shape including a plurality of projections and depressions on a surface opposite to the light-emitting element.

12. The lighting device according to claim 7, wherein a plurality of EL layers is provided with an intermediate layer interposed therebetween.

13. A lighting device comprising:
a holding member; and
a plurality of housings, each one of the plurality of housings including:
a first housing portion comprising:
a first surface that is a bottom surface of the first housing portion; and
a second surface being in an opposite side of the first surface;
wherein the first surface has an uneven shape including a plurality of projections and depressions,
wherein the second surface has an uneven shape including a plurality of projections and depressions, and
wherein a size of the uneven shape of the first surface is larger than a size of the uneven shape of the second surface,
a layer over and in direct contact with the first housing portion, the layer having a refractive index greater than or equal to 1.6;
a second housing portion over the layer;
a first terminal electrode in direct contact with a first peripheral end portion of the each one of the plurality of housings;
a second terminal electrode in direct contact with a second peripheral end portion of the each one of the plurality of housings;
a light-emitting element between the first housing portion and the second housing portion, the light-emitting element comprising:
a first electrode electrically connected to the first terminal electrode, wherein a thickness direction of the first electrode is substantially perpendicular to the first surface;
a second electrode over the first electrode, the second electrode being electrically connected to the second terminal electrode; and
an EL layer between the first electrode and the second electrode;
an adhesive layer over and in direct contact with the second electrode;
a metal layer over and in direct contact with the adhesive layer; and
a resin in direct contact with a top surface of the metal layer and side surfaces of the metal layer, wherein at least a part of the metal layer completely overlaps with the EL layer, wherein at least one of the first housing portion and the second housing portion, that covers a light emitting side of the light-emitting element has a light-transmitting property, wherein at least one of the first electrode and the second electrode, that is provided in the light emitting side of the light-emitting element has a light-transmitting property, wherein the each one of the plurality of housings is capable of being fixed in the holding member, wherein each of the first terminal electrode and the second terminal electrode is electrically connectable with its respective terminal electrode of the holding member by contacting with the respective terminal electrode, wherein the shape of the each one of the plurality of housings is a rectangular solid comprising:
the first surface that is a bottom surface of the rectangular solid;
a third surface that is a top surface of the rectangular solid;

a fourth surface that is a first side surface of the rectangular solid;
a fifth surface that is a second side surface of the rectangular solid;
a sixth surface that is a third side surface of the rectangular solid; and
a seventh surface that is a fourth side surface of the rectangular solid,
wherein each of the first terminal electrode and the second terminal electrode is in direct contact with the fourth surface,
wherein each of the first terminal electrode and the second terminal electrode is not in direct contact with any of the first surface, the third surface, the fifth surface, the sixth surface and the seventh surface,
wherein the fourth surface is substantially perpendicular to the first surface,
wherein an exposed surface of the first terminal electrode is substantially flush with the fourth surface,
wherein an exposed surface of the second terminal electrode is substantially flush with the fourth surface,
wherein the terminal electrode of the holding member includes an elastic material,
wherein the holding member is capable of being mounted on a wall, and
wherein the holding member is capable of being mounted on a ceiling.

14. The lighting device according to claim 13, wherein the first electrode is electrically connected to the first terminal electrode through a first electrode extraction terminal and the second electrode is electrically connected to the second terminal electrode through a second electrode extraction terminal.

15. The lighting device according to claim 13, wherein a plurality of first terminal electrodes and a plurality of second terminal electrodes are provided.

16. The lighting device according to claim 13, wherein a plurality of EL layers is provided with an intermediate layer interposed therebetween.

17. The lighting device according to claim 13,
wherein the uneven shape of the first surface is a circular shape, and
wherein the uneven shape of the second surface is a circular shape.

18. The lighting device according to claim 13,
wherein the adhesive layer is in direct contact with all a side surface of the second electrode, and
wherein the side surface of the second electrode is substantially perpendicular to the first surface.

* * * * *

UNITED STATES PATENT AND TRADEMARK OFFICE
CERTIFICATE OF CORRECTION

PATENT NO. : 9,269,921 B2  
APPLICATION NO. : 13/275522  
DATED : February 23, 2016  
INVENTOR(S) : Kenichi Wakimoto et al.

Page 1 of 1

It is certified that error appears in the above-identified patent and that said Letters Patent is hereby corrected as shown below:

In the Specification:

Column 4, Line 8; Change "surface Of" to --surface of--.

Column 6, Line 59; Change "232, from" to --232 from--.

Column 8, Line 39; Change "the, light-emitting" to --the light-emitting--.

Column 9, Line 4; Change "cycloolefm" to --cycloolefin--.

Column 12, Line 58; Change "[N-(" to --[N'-(--.

Column 12, Line 59; Change "N-phenylamino" to --N'-phenylamino--.

Column 13, Lines 7 to 8; Change "[N,N-bis(" to --[N,N'-bis(--.

Column 13, Line 8; Change "N,N-bis(" to --N,N'-bis(--.

Column 13, Line 64; Change "methyl-l-naphthyl" to --methyl-1-naphthyl--.

Column 15, Lines 15 to 16; Change "difluorophenyppyridinato-N," to
--difluorophenyl)pyridinato-N,--.

Column 15, Line 16; Change "Flrpic)," to --FIrpic),--.

Column 16, Lines 43 to 44; Change "diphenyl-N-{4-[4-(10-phenyl-9-anthryl)phenyl]henyl}-9H" to
--diphenyl-N-[4-(10-phenyl-9-nthryl)phenyl]-9H"--.

Column 21, Line 18; Change "contained, in" to --contained in--.

Column 21, Line 49; Change "n-form" to --β-form--.

Column 22, Line 60; Change "pentadecalluorooctyl" to --pentadecafluorooctyl--.

Column 22, Line 61; Change "naphthalenetetracarb oxylic" to --naphthalenetetracarboxylic--.

Column 23, Line 15; Change "molybdenum; iron," to --molybdenum, iron,--.

Column 23, Line 32; Change "(Embodiment) 4" to --(Embodiment 4)--.

Column 24, Line 43; Change "826, a" to --8262, a--.

Signed and Sealed this
Twenty-sixth Day of July, 2016

Michelle K. Lee
*Director of the United States Patent and Trademark Office*